US012669660B2

(12) United States Patent
Tseng et al.

(10) Patent No.: US 12,669,660 B2
(45) Date of Patent: Jun. 30, 2026

(54) LIGHT DEFLECTION STRUCTURE TO INCREASE OPTICAL COUPLING

(71) Applicant: Taiwan Semiconductor Manufacturing Company, Ltd., Hsinchu (TW)

(72) Inventors: Chih-Wei Tseng, Hsinchu City (TW); Jui Lin Chao, New Taipei City (TW); Hsing-Kuo Hsia, Jhubei City (TW); Yutong Wu, Hsinchu City (TW); Chen-Hua Yu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 538 days.

(21) Appl. No.: 18/149,325

(22) Filed: Jan. 3, 2023

(65) Prior Publication Data

US 2023/0418002 A1 Dec. 28, 2023

Related U.S. Application Data

(60) Provisional application No. 63/420,815, filed on Oct. 31, 2022, provisional application No. 63/394,018, (Continued)

(51) Int. Cl.
*G02B 6/42* (2006.01)
*H10B 80/00* (2026.01)

(52) U.S. Cl.
CPC ......... *G02B 6/4214* (2013.01); *G02B 6/4206* (2013.01); *H10B 80/00* (2023.02)

(58) Field of Classification Search
CPC ............................ G02B 6/4214; G02B 6/4206
See application file for complete search history.

(56) References Cited

U.S. PATENT DOCUMENTS 6,940,885 B1 * 9/2005 Cheng ..................... H01S 5/041
                                                        372/75
8,818,145 B2 * 8/2014 Bowen ................. G02B 6/4214
                                                        385/14
(Continued)

FOREIGN PATENT DOCUMENTS

KR      20090016145 A      2/2009

OTHER PUBLICATIONS

Baba et al. "Photonic Crystal Light Deflection Devices Using the Superprism Effect" IEEE Journal of Quantum Electronics, vol. 38, Issue: 7, published Jul. 2002.
(Continued)

*Primary Examiner* — Thomas A Hollweg
*Assistant Examiner* — Marc E Manheim
(74) *Attorney, Agent, or Firm* — Eschweiler & Potashnik, LLC

(57) ABSTRACT

Various embodiments of the present disclosure are directed towards a semiconductor device including a dielectric structure disposed on a first substrate. An edge coupler is disposed within the dielectric structure and comprises a plurality of optical core segments. A deflector structure is disposed within the dielectric structure and is laterally adjacent to the edge coupler. The deflector structure is configured to redirect an optical signal traveling along a first direction to a second direction towards the edge coupler.

20 Claims, 26 Drawing Sheets

Related U.S. Application Data filed on Aug. 1, 2022, provisional application No. 63/354,768, filed on Jun. 23, 2022.

(56) References Cited

U.S. PATENT DOCUMENTS

| | | | | |
|---|---|---|---|---|
| 9,618,698 | B2 * | 4/2017 | Svilans | G02B 6/12004 |
| 10,830,951 | B2 * | 11/2020 | Noriki | G02B 6/122 |
| 11,513,289 | B1 * | 11/2022 | Lin | G01S 7/4816 |
| 2015/0355409 | A1 * | 12/2015 | Yanagisawa | G02B 6/42 |
| | | | | 385/14 |
| 2016/0195678 | A1 | 7/2016 | Doany et al. | |
| 2017/0207600 | A1 | 7/2017 | Klamkin et al. | |
| 2018/0239095 | A1 | 8/2018 | Wade et al. | |
| 2019/0011652 | A1 * | 1/2019 | Chang | H05K 1/181 |
| 2020/0132949 | A1 * | 4/2020 | Huang | G02B 6/428 |
| 2020/0393616 | A1 | 12/2020 | Schmid et al. | |
| 2023/0094780 | A1 * | 3/2023 | Testa | G02B 6/421 |
| | | | | 385/33 |
| 2023/0185033 | A1 * | 6/2023 | Darmawikarta | G02B 6/4239 |
| | | | | 385/14 |
| 2023/0194804 | A1 * | 6/2023 | Taha | G02B 6/30 |
| | | | | 385/31 |
| 2023/0333334 | A1 | 10/2023 | Saito et al. | |

OTHER PUBLICATIONS

Digaum et al. "Tight control of light beams in photonic crystals with spatially-variant lattice orientation" Opt. Express 22, 25788-25804 (2014), published on Oct. 14, 2014.

* cited by examiner

100

Optical Receiver or Transmitter
126

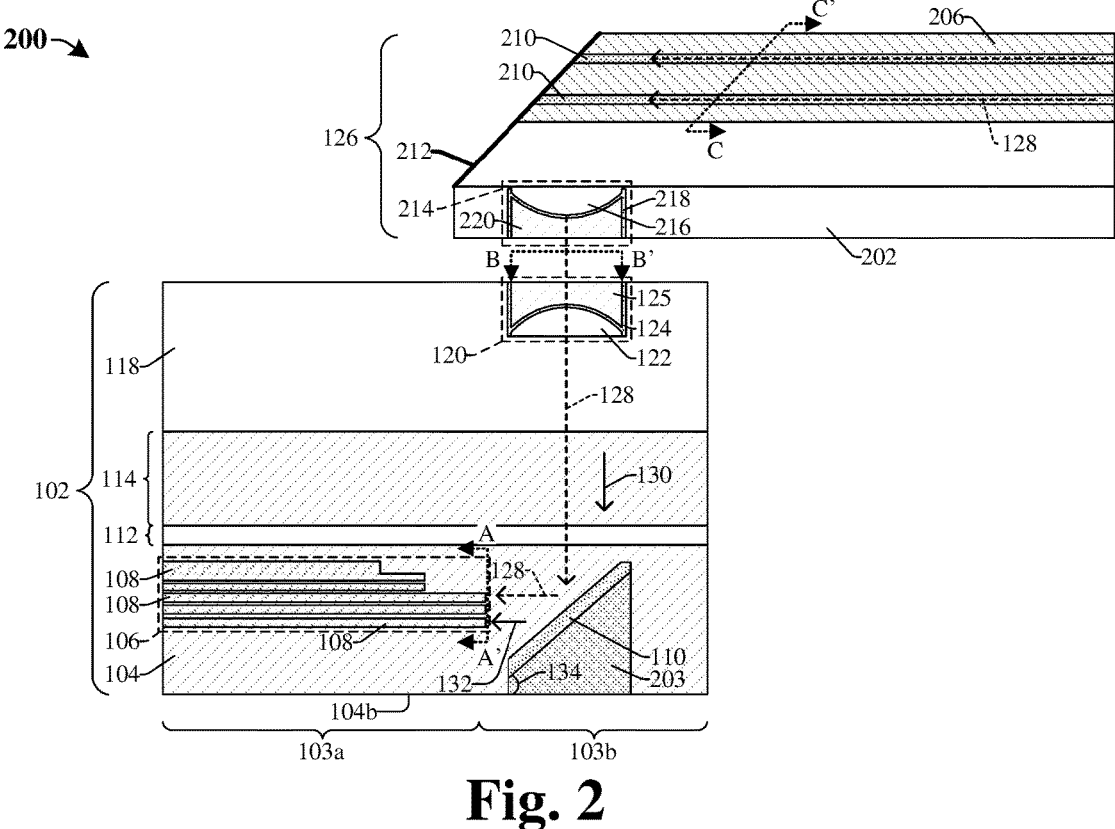
Fig. 2
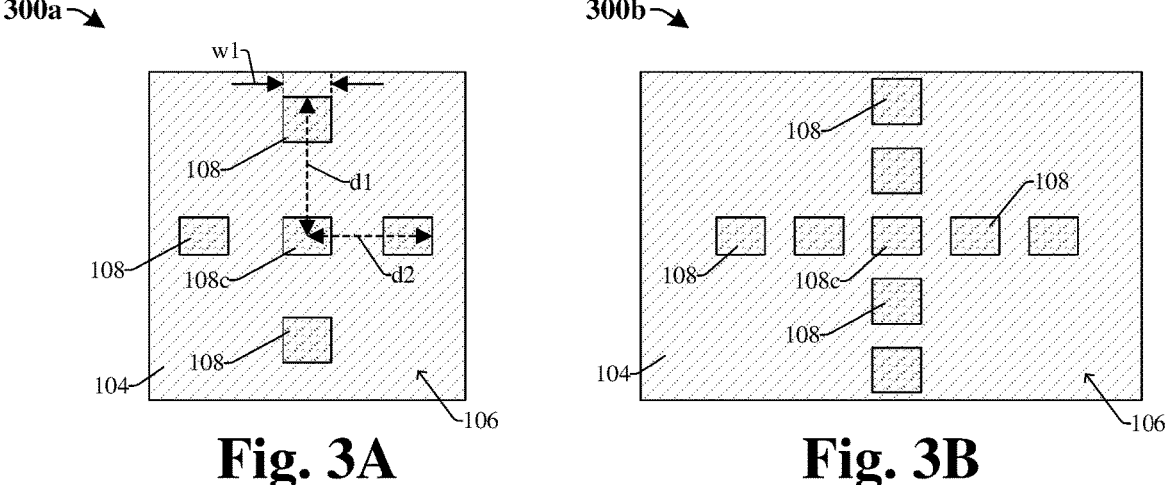
Fig. 3A          Fig. 3B

1500

1600

2100

2200

2500

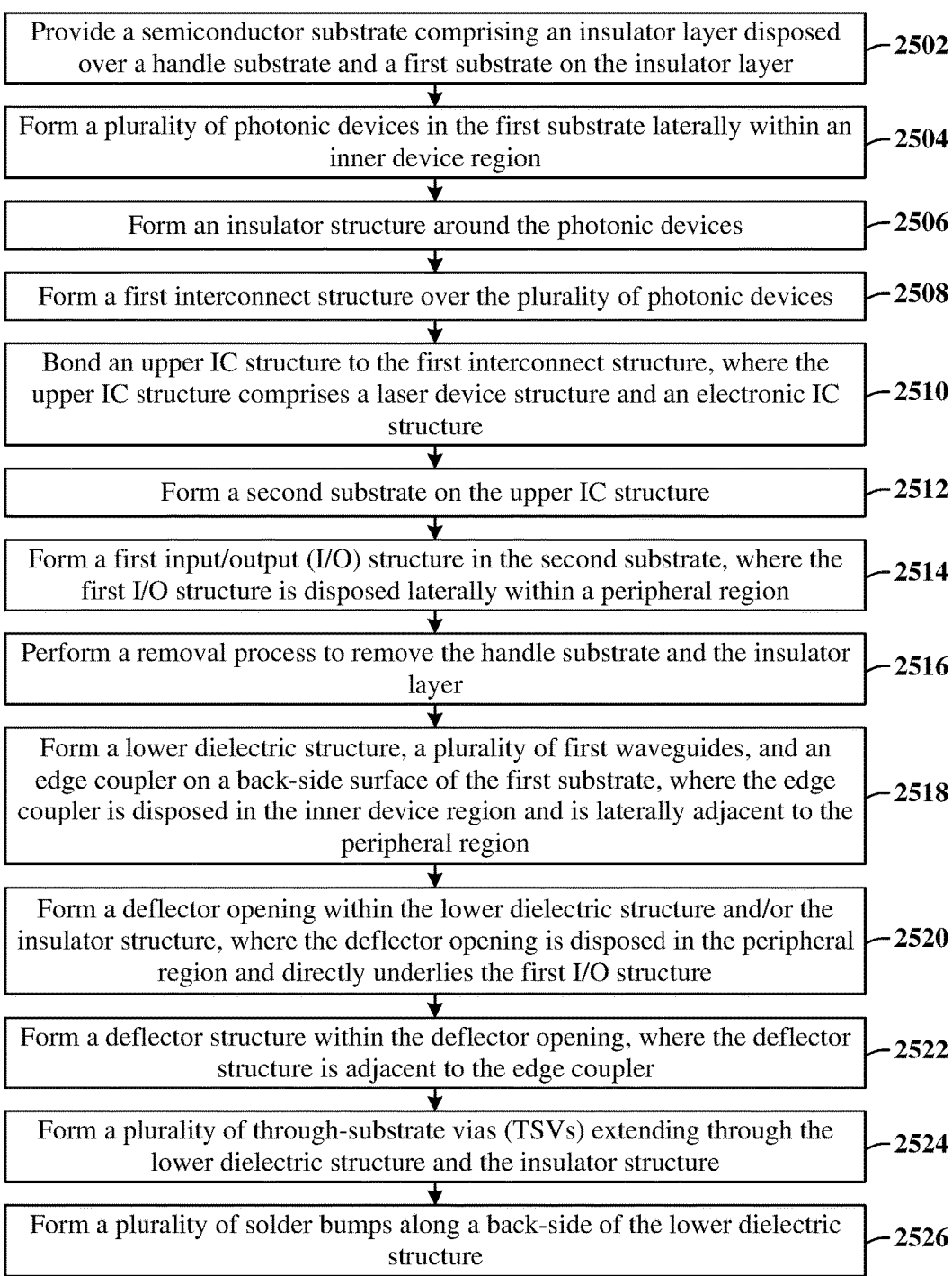

Provide a semiconductor substrate comprising an insulator layer disposed over a handle substrate and a first substrate on the insulator layer ——2502

Form a plurality of photonic devices in the first substrate laterally within an inner device region ——2504

Form an insulator structure around the photonic devices ——2506

Form a first interconnect structure over the plurality of photonic devices ——2508

Bond an upper IC structure to the first interconnect structure, where the upper IC structure comprises a laser device structure and an electronic IC structure ——2510

Form a second substrate on the upper IC structure ——2512

Form a first input/output (I/O) structure in the second substrate, where the first I/O structure is disposed laterally within a peripheral region ——2514

Perform a removal process to remove the handle substrate and the insulator layer ——2516

Form a lower dielectric structure, a plurality of first waveguides, and an edge coupler on a back-side surface of the first substrate, where the edge coupler is disposed in the inner device region and is laterally adjacent to the peripheral region ——2518

Form a deflector opening within the lower dielectric structure and/or the insulator structure, where the deflector opening is disposed in the peripheral region and directly underlies the first I/O structure ——2520

Form a deflector structure within the deflector opening, where the deflector structure is adjacent to the edge coupler ——2522

Form a plurality of through-substrate vias (TSVs) extending through the lower dielectric structure and the insulator structure ——2524

Form a plurality of solder bumps along a back-side of the lower dielectric structure ——2526

LIGHT DEFLECTION STRUCTURE TO INCREASE OPTICAL COUPLING

REFERENCE TO RELATED APPLICATIONS

This Application claims the benefit of U.S. Provisional Application No. 63/354,768, filed on Jun. 23, 2022, U.S. Provisional Application No. 63/394,018, filed on Aug. 1, 2022, & U.S. Provisional Application No. 63/420,815, filed on Oct. 31, 2022. The contents of the above-referenced Patent Applications are hereby incorporated by reference in their entirety.

BACKGROUND

A system-on-a-chip (SoC) has traditionally been formed from a single integrated circuit (IC) chip containing all functionality. However, more recently, a chiplet design has emerged. Instead of one large IC chip, multiple smaller IC chips are packaged together to form the SoC. The smaller IC chips are more aptly referred to as chiplets and implement individual functional blocks of the SoC. Among other things, the chiplet design may reduce waste/increase yields, allow smaller components, and enable bigger chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates some other embodiments of the electronic system where the photonic chip comprises a first input/output (I/O) structure underlying a second I/O structure of an optical transmitter or receiver.

FIGS. 3A-3G illustrates various cross-sectional views of some other embodiments of a plurality of optical core segments of an edge coupler.

FIG. 25 illustrates a flowchart of some embodiments of a method for forming a photonic chip that comprises a deflector structure laterally adjacent to an edge coupler.

DETAILED DESCRIPTION

Figure 1:
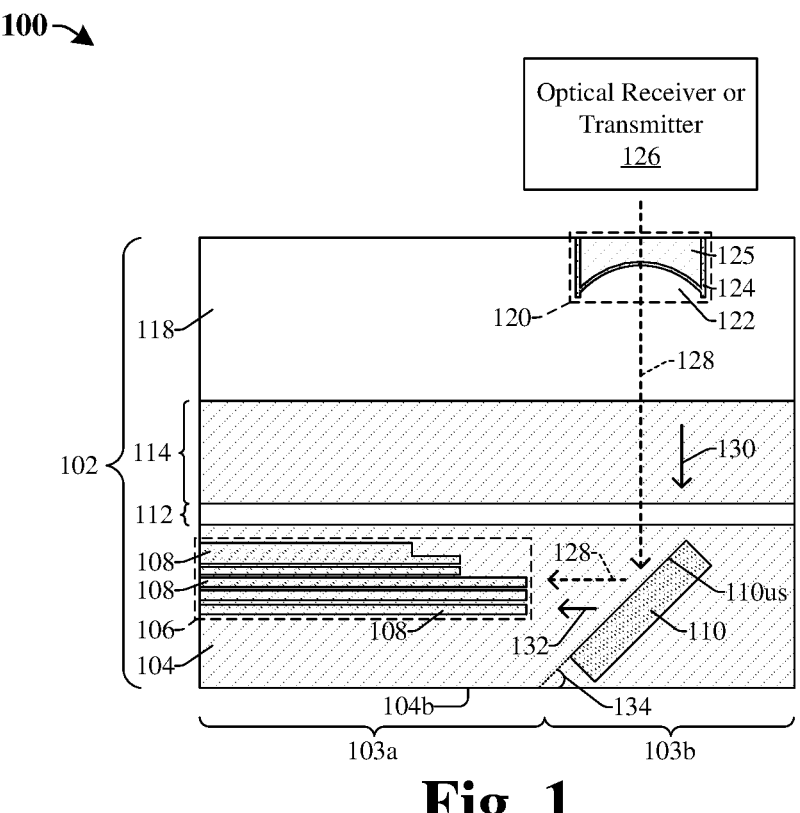
FIG. 1 illustrates a cross-sectional view of some embodiments of an electronic system including a photonic chip that comprises an edge coupler having a plurality of optical core segments adjacent to a deflector structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A system-on-a-chip (SoC) with a chiplet design may comprise a plurality of integrated circuit (IC) chiplets packed together. For example, the SoC may comprise a memory chiplet, a memory controller chiplet (e.g., an application-specific integrated circuit (ASIC)), and a photonic chiplet packaged together on a substrate. The IC chiplets implement individual functional blocks of the SoC and communicate electrically with one another. An optical transmitter or receiver may be disposed over the SoC and is optically coupled to the SoC. For example, the photonic chiplet of the SoC may comprise one or more grating couplers directly underlying a first optical input/output (I/O) structure. Further, the optical transmitter or receiver comprises one or more optical fibers configured to carry light and a second optical I/O structure underlying the optical fibers. The second optical I/O structure may be aligned over the first optical I/O structure, such that light from the one or more optical fibers may be transmitted vertically to the one or more grating couplers by way of the first and second optical I/O structures. The grating couplers are configured to transmit the inputted light horizontally within the SoC. However, the grating couplers are wavelength sensitive and polarization specific devices, such that at least a portion of the inputted light from the optical fibers is not absorbed or transmitted by the grating couplers. As such, the grating couplers may reduce optical coupling between the photonic chiplet and the optical transmitter or receiver.

Various embodiments of the present disclosure are directed towards a semiconductor package having a photonic chip that comprises an edge coupler and a deflector structure configured to increase optical coupling. The photonic chip comprises one or more photonic devices disposed on and/or within a first substrate. The edge coupler is adjacent to a peripheral region of the photonic chip and the deflector structure is disposed in the peripheral region next to the edge coupler. A first optical I/O structure is disposed on the photonic chip over the deflector structure. An optical transmitter or receiver overlies the photonic chip and comprises a second optical I/O structure aligned with the first optical I/O structure. The optical transmitter or receiver comprises one or more optical fibers that are configured to direct an input optical signal vertically towards the second optical I/O structure. The inputted optical signal may travel from the second optical I/O structure through the first I/O structure towards the deflector structure. The deflector structure is configured to direct the inputted optical signal towards the edge coupler. For example, a shape, orientation, and/or material of the deflector structure are configured to direct the inputted optical signal from the peripheral region of the photonic chip towards the edge coupler. The edge coupler comprises one or more optical structures that are polarization independent and may receive a wide range of wavelengths. Accordingly, the upper optical transmitter or receiver may communicate optically with the photonic chip by way of the optical fibers, edge coupler, and deflector structure. In addition, the deflector structure and edge coupler are configured to reduce loss of the inputted optical signal, thereby increasing optical coupling between the photonic chip and the optical transmitter or receiver.

FIG. 1 illustrates a cross-sectional view 100 of some embodiments of an electronic system including a photonic chip 102 that comprises an edge coupler 106 adjacent to a deflector structure 110.

The electronic system comprises the photonic chip 102 and an optical transmitter or receiver 126. The optical transmitter or receiver 126 may be or comprise an upper photonic chip, a plurality of optical fiber, or some other suitable component, which is configured to transmit and/or receive an optical signal 128 along an optical communication path between the optical transmitter or receiver 126 and the photonic chip 102. The photonic chip 102 is configured to interact with the optical transmitter or receiver 126 through the optical communication path. The photonic chip 102 comprises a lower dielectric structure 104 disposed on a first substrate 112, a semiconductor structure 114 disposed over the first substrate 112, and a second substrate 118 overlies the semiconductor structure 114. Further, the photonic chip 102 comprises a first optical input/output (I/O) structure 120 disposed in the second substrate 118 and configured to facilitate receiving and/or transmitting the optical signal 128 to or from the optical transmitter or receiver 126. In various embodiments, the photonic chip 102 may include circuitry or other structures that can generate optical signals, detect optical signals, analyze optical signals, modify optical signals, transfer optical signals, and/or transform optical signals to electrical signals (or vice versa), thereby enabling communication and/or signal processing between the photonic chip 102 and the optical transmitter or receiver 126.

The photonic chip 102 comprises an inner device region 103a laterally adjacent to a peripheral region 103b. The edge coupler 106 and the deflector structure 110 are disposed within the lower dielectric structure 104. The edge coupler 106 is laterally within the inner device region 103a and the deflector structure 110 is laterally within the peripheral region 103b. In some embodiments, the edge coupler 106 comprises a plurality of optical core segments 108 vertically stacked over one another. The first I/O structure 120 is disposed laterally within the peripheral region 103b and directly overlies the deflector structure 110. The first I/O structure 120 comprises a first lens 122, a first liner structure 124, and a first insulator layer 125. The first lens 122 has a convex upper surface extending towards the first insulator layer 125. In various embodiments, the first lens 122 is part of the second substrate 118.

In various embodiments, the optical transmitter or receiver 126 is configured to transmit the optical signal 128 in a first direction 130 towards the deflector structure 110. The deflector structure 110 is configured to redirect the transmitted optical signal 128 from the first direction 130 to a second direction 132 towards the edge coupler 106. For example, the deflector structure 110 may comprise a reflector material (e.g., a metal material such as copper, aluminum, tantalum, etc.) and an upper surface 110us slanted relative to the second direction 132 such that the optical signal 128 hits the deflector structure 110 and is redirected towards the edge coupler 106. Accordingly, due to a shape, material, and/or orientation of the deflector structure 110 the optical signal 128 is directed towards the edge coupler 106 with minimal loss. The plurality of optical core segments 108 of the edge coupler 106 are polarization independent such that the edge coupler 106 may receive a wide range of wavelengths thereby increasing coupling efficiency of the edge coupler 106. Thus, the deflector structure 110 and the edge coupler 106 are configured to mitigate or prevent loss of the optical signal 128 transmitted by the optical transmitter or receiver 126. Thus, the deflector structure 110 and the edge coupler 106 facilitate good optical coupling between the photonic chip 102 and the optical transmitter or receiver 126.

In various embodiments, the deflector structure 110 may be configured and/or referred to as a reflector structure, an optical redirector structure, a mirror structure, or the like. Further, the upper surface 110us of the deflector structure 110 may be flat and faces the edge coupler 106. In addition, the deflector structure 110 may have a curved surface facing the edge coupler 106, may comprise one or more layers (e.g., one or more dielectric layers), may be or comprise a mirror, may be or comprise one or more photonic crystals, may be or comprise a conductive material, and/or may have a spherical shape. In further embodiments, the upper surface 110us of the deflector structure 110 is slanted by an angle 134 relative to a back-side 104b of the lower dielectric structure 104. In some embodiments, the angle 134 is within a range of about 15° to about 65°, or some other suitable value.

FIG. 2 illustrates a cross-sectional view 200 of some other embodiments of the electronic system of FIG. 1, where the photonic chip 102 comprises the first I/O structure 120 and the optical transmitter or receiver 126 comprises a second I/O structure 214 overlying the first I/O structure 120.

In some embodiments, the optical transmitter or receiver 126 comprises an upper substrate 202, an index matching structure 206 disposed within and/or on the upper substrate 202, a plurality of optical fibers 210 disposed in the index matching structure 206, and the second I/O structure 214. In various embodiments, the optical transmitter or receiver 126 may be configured as and/or referred to as an optical engine, an integrated fiber array unit structure, or the like. The optical transmitter or receiver 126 is configured to generate or receive an optical signal 128. The optical fibers 210 are disposed within the upper substrate 202 and are configured to transmit or carry the optical signal 128 across the optical transmitter or receiver 126 towards the second I/O structure 214. For example, the optical fibers 210 transfer the optical signal 128 along the second direction 132 towards the second I/O structure 214. In various embodiments, outer edges of the upper substrate 202 and/or the optical fibers 210 are polished such that an upper deflector 212 is disposed along the outer edges of the upper substrate 202 and/or the optical fibers 210. This, in part, facilitates the optical transmitter or receiver 126 directing the optical signal 128 towards the second I/O structure 214 in the first direction 130. For example, the upper deflector 212 is configured to reflect or transmit the optical signal 128 from the second direction 132 to the first direction 130 towards the deflector structure 110.

The second I/O structure 214 is disposed within the upper substrate 202 and comprises a second lens 216, a second liner structure 218, and a second insulator layer 220. The second lens 216 has a convex lower surface extending towards the first I/O structure 120. In some embodiments, the second lens 216 is part of the upper substrate 202. The second liner structure 218 conforms to a curved shaped of the second lens 216. The optical signal 128 is transmitted from the second I/O structure 214 along the first direction 130 towards the first I/O structure 120, such that the optical transmitter or receiver 126 is optically coupled to the photonic chip 102. In various embodiments, the optical signal 128 is may be scattered and/or deflected from the deflector structure 110 towards the edge coupler 106. The plurality of optical core segments 108 is polarization independent and configured to receive a wide range of wavelengths, such that the edge coupler 106 may efficiently receive the scattered and/or deflected optical signal 128 from the deflector structure 110 with minimal loss. As a result, the deflector structure 110 and the edge coupler 106 increases optical coupling between the photonic chip 102 and the optical transmitter or receiver 126, thereby increasing an overall performance of the electronic system.

FIGS. 3A-3G illustrate various cross-sectional views 300a-300g of some embodiments of the plurality of optical core segments 108 of the edge coupler 106 taken along the line A-A' of the cross-sectional view of FIG. 2.

As illustrated by the cross-sectional view 300a of FIG. 3A, the edge coupler 106 comprises the plurality of optical core segments 108 arranged in a cross like layout or cross like shape when viewed in cross section. In various embodiments, the edge coupler 106 comprises at least five optical core segments 108, however, the edge coupler 106 may comprise any number of optical core segments 108. In further embodiments, each optical core segment 106 has a rectangular shape, a square shape, or another suitable shape when viewed in cross-section. In yet further embodiments, the edge coupler 106 is rotational symmetric about a center optical core segment 108c. For example, the edge coupler 106 may have rotational symmetry of at least order two, order three, or order four with respect to the center optical core segment 108c. This, in part, facilitates the edge coupler 106 being polarization independent and facilitates the edge coupler 106 receiving a wide range of wavelengths, thereby increasing a performance of the edge coupler 106.

In some embodiments, each optical core segment 106 has a width w1 that is within a range of about 0.16 micrometers (um) to about 0.5 um, or some other suitable value. In various embodiments, a first distance d1 between a center of the center optical core segment 108c and upper and/or lower optical core segments is about 1 um, within a range of about 0.8 um to about 1.2 um, or some other suitable value. In yet further embodiments, a second distance d2 between the center of the center optical core segment 108c and laterally adjacent optical core segments is within a range of about 0.5 um to about 1.6 um, or some other suitable value.

As illustrated by the cross-sectional view 300b of FIG. 3B, the edge coupler 106 comprises at least nine optical core segments 108. It will be appreciated that while FIG. 3B illustrates the edge coupler 106 comprising nine optical core segments 108, this is a non-limiting example and the edge coupler 106 may comprise any number of optical core segments 108. In various embodiments, the edge coupler 106 has rotational symmetry of at least order four with respect to the center optical core segment 108c. In yet further embodiments, each of the optical core segments 108 may have a rectangular shape, a square shape, a circular shape, or another suitable shape and may each have a same width or radius.

Figures 3C, 3D, 3E, 3F, 3G:
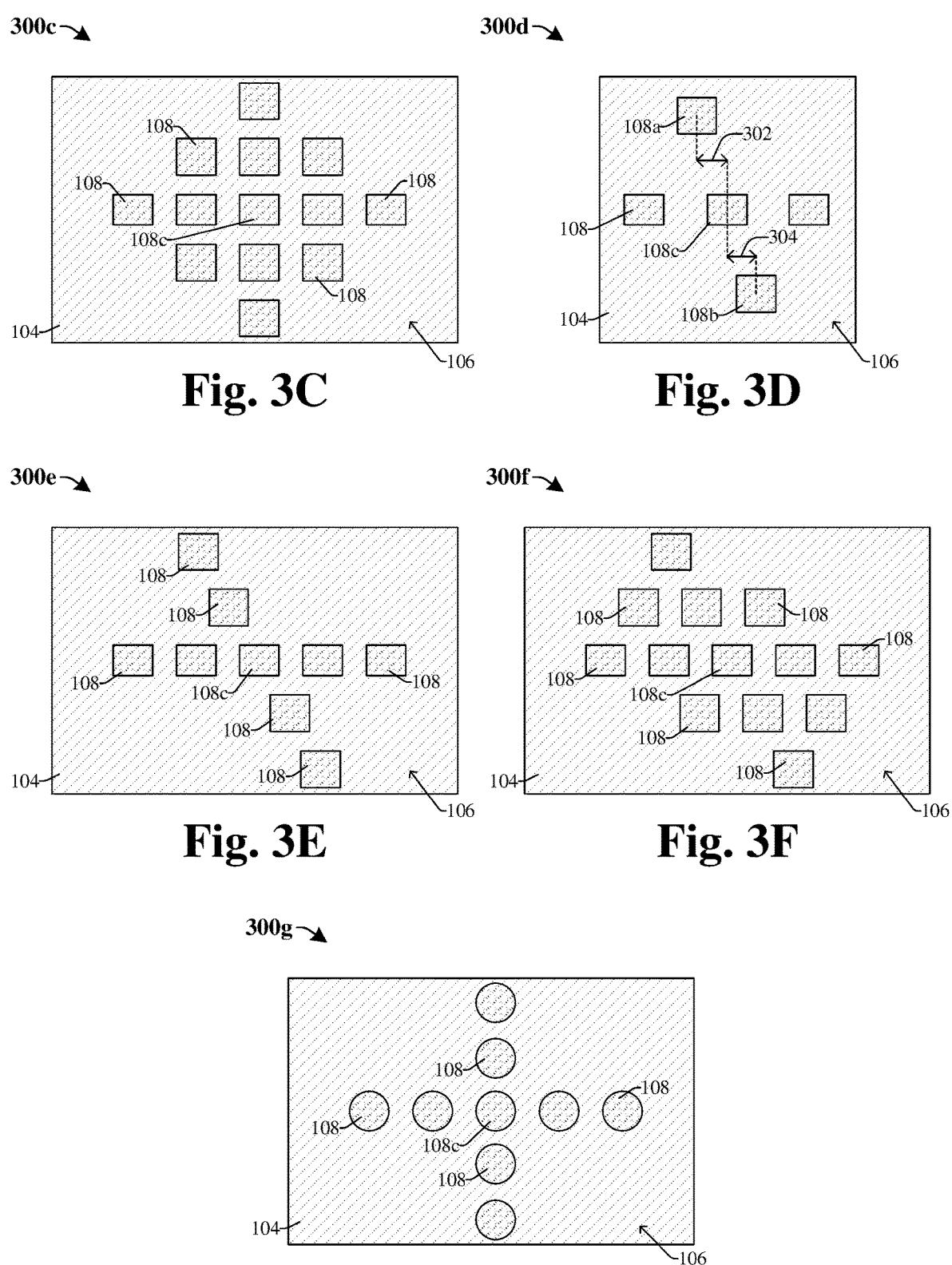

As illustrated by the cross-sectional view 300c of FIG. 3C, the edge coupler 106 comprises at least thirteen optical core segments 108. It will be appreciated that while FIG. 3C illustrates the edge coupler 106 comprising thirteen optical core segments 108, this is a non-limiting example and the edge coupler 106 may comprise any number of optical core segments 108. In various embodiments, the edge coupler 106 has rotational symmetry of at least order four with respect to the center optical core segment 108c.

As illustrated by the cross-sectional view 300d of FIG. 3D, the edge coupler 106 comprises the center optical core segment 108c, an upper optical core segment 108a, and a lower optical core segment 108b. In some embodiments, a center of the center optical core segment 108c is laterally offset from the upper optical core segment 108a by a first distance 302 and is laterally offset from a lower optical core segment 108b by a second distance 304. In various embodiments, the first distance 302 and the second distance 304 are each about half a width of the center optical core segment 108c, within 0.08 um to about 0.25 um, or some other suitable value. In some embodiments, the edge coupler 106 has rotational symmetry of at least order two with respect to the center optical core segment 108c.

As illustrated by the cross-sectional view 300e of FIG. 3E, the edge coupler 106 comprises a plurality of upper optical core segments 108 disposed above the center optical core segment 108c and a plurality of lower optical core segments 108 disposed bellow the center optical core segment 108c. In various embodiments, centers of the upper optical core segments are laterally offset from one another and a center of the center optical core segment 108c. In further embodiments, centers of the lower optical core segments 108 are laterally offset from one another and a center of the center optical core segment 108c.

As illustrated by the cross-sectional view 300f of FIG. 3F, the edge coupler 106 comprises a plurality of plurality of upper optical core segments 108 over the center optical core segment 108c and a plurality of lower optical core segments 108 disposed bellow the center optical core segment 108c. In various embodiments, centers of the upper optical core segments are laterally offset from one another and a center of the center optical core segment 108c. In further embodiments, centers of the lower optical core segments 108 are laterally offset from one another and a center of the center optical core segment 108c.

As illustrated by the cross-sectional view 300f of FIG. 3G, the edge coupler 106 comprises at least nine optical core segments 108, where each optical core segment 108 has a circular shape. It will be appreciated that while FIG. 3G illustrates the edge coupler 106 comprising nine optical core segments 108, this is a non-limiting example and the edge coupler 106 may comprise any number of optical core segments 108. In various embodiments, the edge coupler 106 has rotational symmetry of at least order four with respect to the center optical core segment 108c.

Figure 4A:
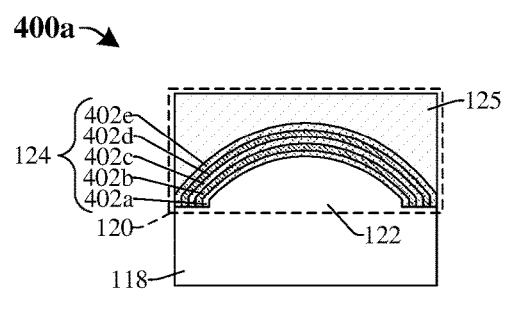
FIGS. 4A and 4B illustrate various views of some embodiments of the first I/O structure of FIG. 2.
Figure 4B:
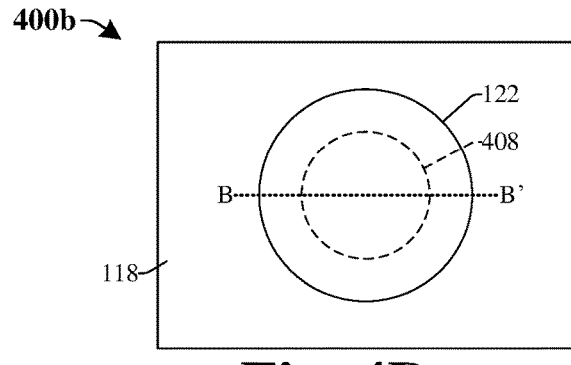

FIGS. 4A and 4B illustrate various views of some embodiments of the first I/O structure 120 of FIG. 1 or FIG. 2. FIG. 4A illustrates a cross-sectional view 400a of some embodiments of the first I/O structure 120. FIG. 4B illustrates a top view 400b of some embodiments of the first I/O structure 120 taken along the line B-B' of FIG. 2.

As illustrated by the cross-sectional view 400a of FIG. 4A, the first liner structure 124 may comprise a plurality of dielectric layers 402a-e. In some embodiments, the plurality of dielectric layers 402a-e comprises a first dielectric layer 402a disposed along the first lens 122, a second dielectric layer 402b disposed on the first dielectric layer 402a, a third dielectric layer 402c disposed on the second dielectric layer 402b, a fourth dielectric layer 402d disposed on the third dielectric layer 402c, and a fifth dielectric layer 402e disposed on the fourth dielectric layer 402d. In various embodiments, the plurality of dielectric layers 402a-e may, for example, be or comprise an oxide (e.g., silicon dioxide), a nitride (e.g., silicon nitride), a metal oxide (e.g., titanium oxide), another dielectric material, or the like. In further embodiments, the first, third, and fifth dielectric layers 402a, 402c, 402e may comprise a first dielectric material (e.g., silicon dioxide) and the second and fourth dielectric layers 402b, 402d may comprise a second dielectric material (e.g., silicon nitride or titanium oxide) different from the first dielectric material. In various embodiments, a radius of curvature of the first lens 122 is about 235 um, about 275 um, within a range of about 235 um to 275 um, or some other suitable value.

As illustrated by the top view 400b of FIG. 4B, the first lens 122 comprises an inner region 408 laterally encloses by an outer perimeter of the first lens 122. In some embodiments, the inner region 408 directly overlies the deflector structure (110 of FIG. 2).

Figure 5A:
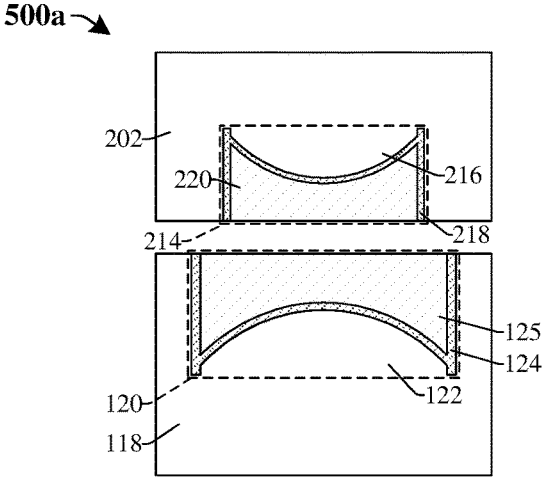
FIGS. 5A-5C illustrate various cross-sectional views of some embodiments of the first I/O structure and the second I/O structure of FIG. 2.
Figure 5B:
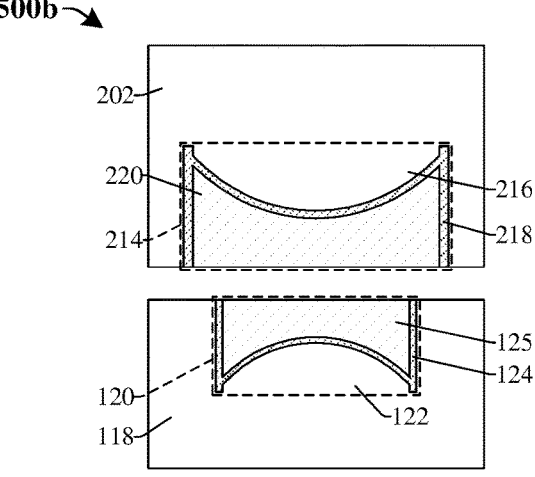
Figure 5C:
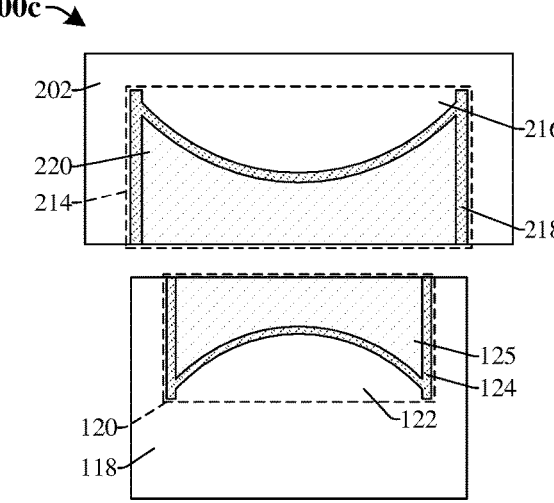

FIGS. 5A-5C illustrate various cross-sectional views 500a-500c of some embodiments of the first I/O structure 120 and the second I/O structure 214 of FIG. 2.

As illustrated by the cross-sectional view 500a of FIG. 5A, a size of the first lens 122 of the first I/O structure 120 is greater than a size of the second lens 216 of the second I/O structure 214. This, in part, facilitates correcting divergence of light while transmitting an optical signal from the second I/O structure 214 towards the first I/O structure 120. In various embodiments, the second lens 216 is substantially small and the first lens 122 is large. In some embodiments, sidewalls of the second liner structure 218 are disposed laterally between sidewalls of the first liner structure 124.

As illustrated by the cross-sectional view 500b of FIG. 5B, a size of the first lens 122 of the first I/O structure 120 is less than a size of the second lens 216 of the second I/O structure 214. This, in part, facilitates correcting divergence of light across the plurality of optical fibers (210 of FIG. 2) while transmitting an optical signal from the optical fibers (210 of FIG. 2) and second I/O structure 214 towards the first I/O structure 120. In various embodiments, the first lens 122 is substantially small and the second lens 216 is large. In some embodiments, sidewalls of the first liner structure 124 are disposed laterally between sidewalls of the second liner structure 218.

As illustrated by the cross-sectional view 500c of FIG. 5C, the second lens 216 of the second I/O structure 214 is larger than the first lens 122 of the first I/O structure 120. In various embodiments, a width of the first lens 122 is less than a width of the second lens 216.

FIGS. 6A-6G illustrate various cross-sectional views 600a-600g of some embodiments of the edge coupler 106 and the deflector structure 110. In various embodiments, FIGS. 6A-6G illustrate other embodiments of the edge coupler 106 and the deflector structure 110 of FIGS. 1 and 2.

Figures 6A, 6B, 6C, 6D, 6E, 6F:
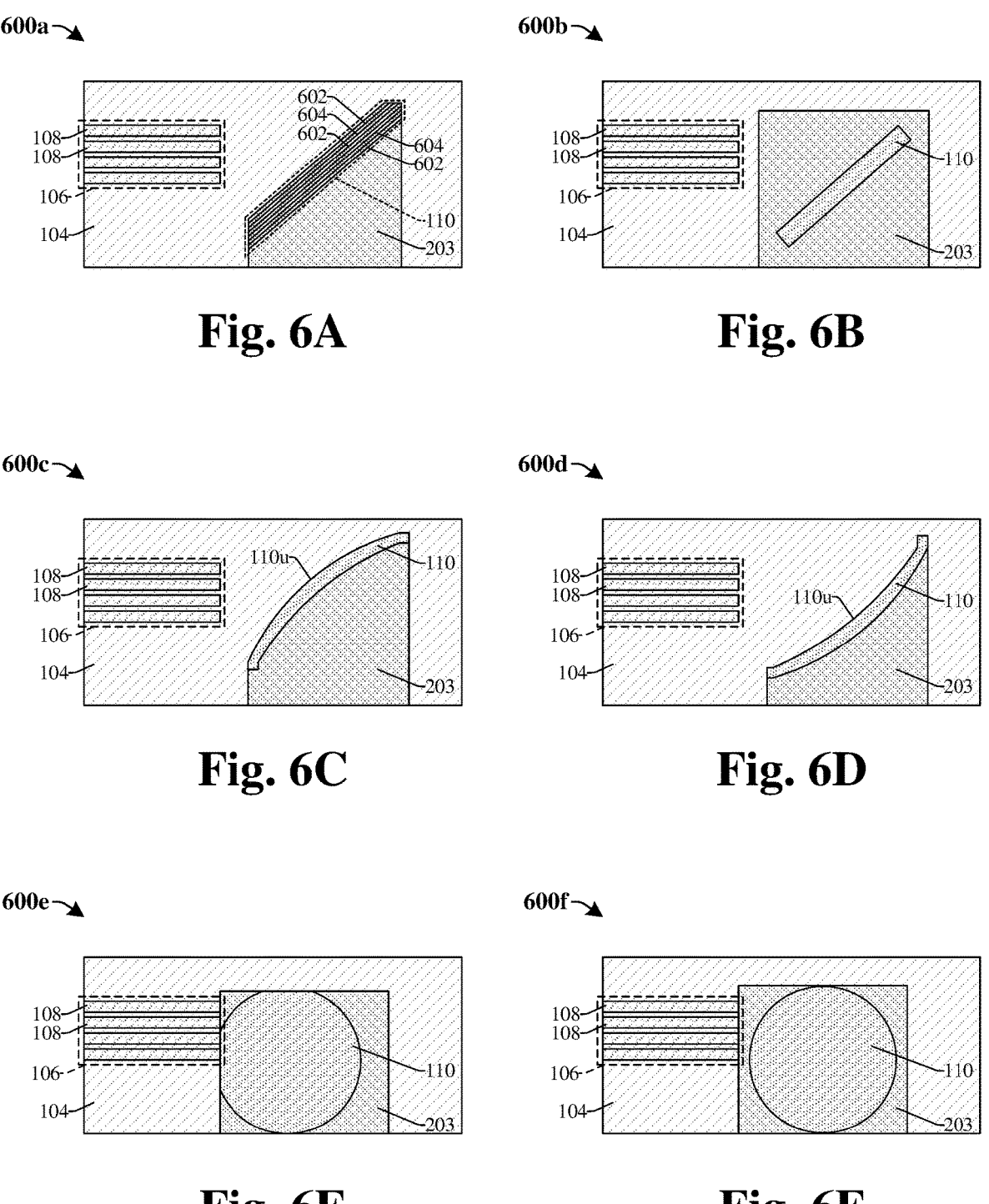
FIGS. 6A-6G illustrate various cross-sectional views of some embodiments of a deflector structure laterally adjacent to an edge coupler.

As illustrated by the cross-sectional view 600a of FIG. 6A, in some embodiments, the deflector structure 110 comprises a plurality of first deflector layers 602 and a plurality of second deflector layers 604. In various embodiments, each second deflector layer 604 is disposed between adjacent first deflector layers 602. In some embodiments, the first and second deflector layers 602, 604 may, for example, each be or comprise a mirror layer, silicon nitride, silicon dioxide, titanium oxide, aluminum oxide, another material, or the like. In further embodiments, the first deflector layers 602 may comprise a first material (e.g., silicon nitride, silicon dioxide, etc.) and the second deflector layers 604 may comprise a second material (e.g., titanium oxide, aluminum oxide, etc.) different from the first material. In yet further embodiments, the lower insulator structure 203 continuously extends from a lower surface of the deflector structure 110 to sidewalls of the lower dielectric structure 104.

As illustrated by the cross-sectional view 600b of FIG. 6B, in some embodiments, the deflector structure 110 is embedded in the lower insulator structure 203. In various embodiments, the lower insulator structure 203 continuously wraps around an upper surface, a lower surface, and sidewalls of the deflector structure 110. In further embodiments, the deflector structure 110 may, for example, be or comprise copper, aluminum, tantalum, aluminum copper, aluminum copper silicon, another suitable material, or any combination of the foregoing.

As illustrated by the cross-sectional view 600c of FIG. 6C, in some embodiments, the deflector structure 110 comprises an upper surface 110u that curves towards sidewalls of the optical core segments 108. In various embodiments, the upper surface 110u of the deflector structure 110 is convex. In further embodiments, the convex upper surface 110u of the deflector structure 110 is configured to redirect incident light downwards towards the optical core segments 108.

As illustrated by the cross-sectional view 600d of FIG. 6D, in some embodiments, the deflector structure 110 comprises an upper surface 110u that curves away from sidewalls of the optical core segments 108. In various embodiments, the upper surface 110*u* of the deflector structure 110 is concave. In further embodiments, the concave upper surface 110*u* of the deflector structure 110 is configured to redirect incident light upwards towards the optical core segments 108.

As illustrated by the cross-sectional view 600*e* of FIG. 6E, in some embodiments, the deflector structure 110 has a circular shape. In various embodiments, the deflector structure 110 may contact an upper surface and a sidewall of the lower dielectric structure 104.

As illustrated by the cross-sectional view 600*f* of FIG. 6F, in some embodiments, the deflector structure 110 has a circular shape and is laterally offset from opposing sidewalls of the lower dielectric structure 104.

Figures 6G, 7A, 7B, 7C, 8:
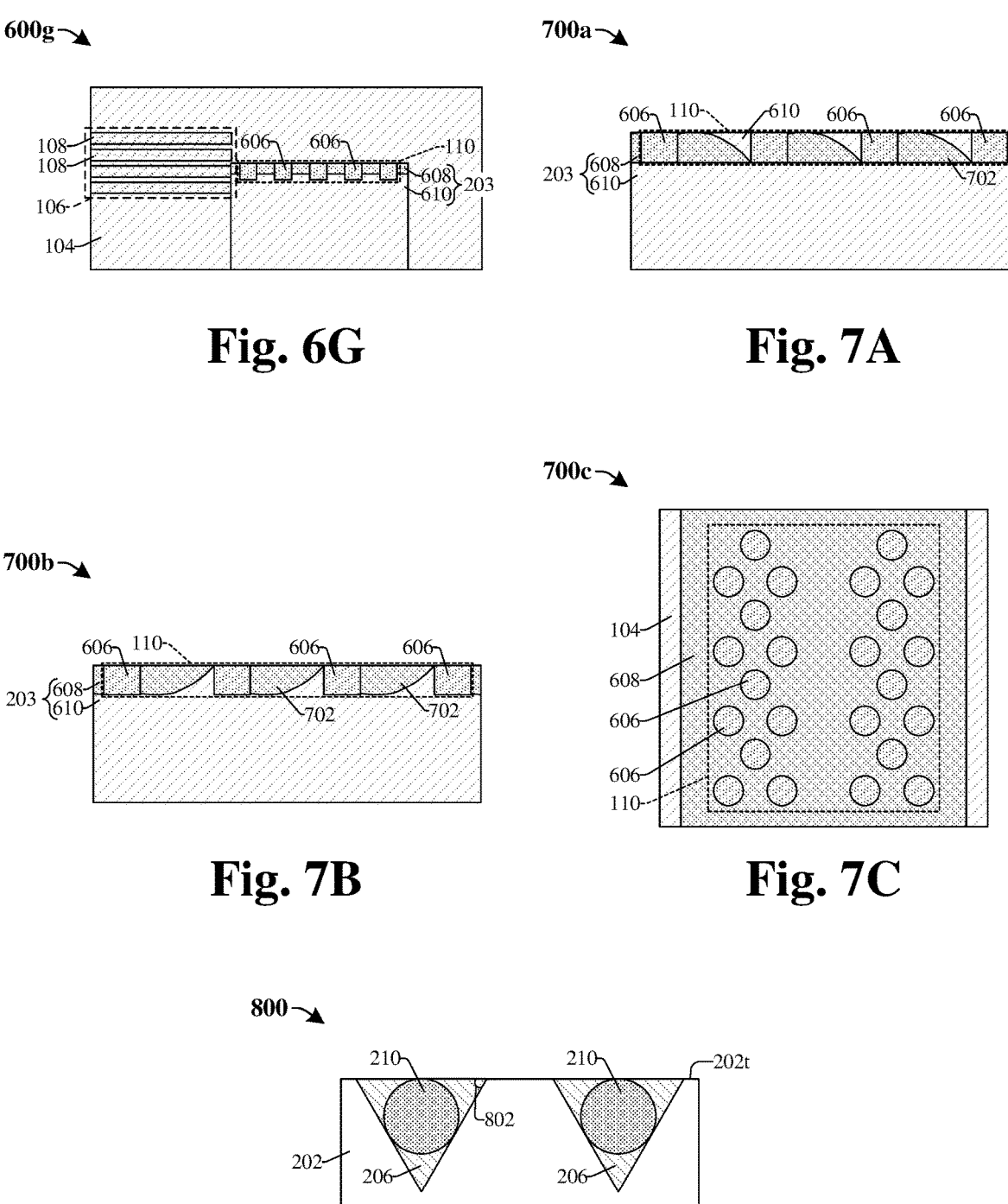
FIGS. 7A-7C illustrate various views of some embodiments of the deflector structure of FIG. 6G.
FIG. 8 illustrates a cross-sectional view of some embodiments of a plurality of optical fibers.

As illustrated by the cross-sectional view 600*g* of FIG. 6G, in some embodiments, the deflector structure 110 comprises a plurality of photonic crystal structures 606 configured to redirect incident light towards the optical core segments 108. In various embodiments, the lower insulator structure 203 comprises a first insulator layer 608 and a second insulator layer 610. In further embodiments, the first insulator layer 608 is disposed between adjacent photonic crystal structures 606. In further embodiments, the plurality of photonic crystal structures 606, the first insulator layer 608, and the second insulator layer 610 comprise different materials with different refractive indices. This, in part, facilitates the deflector structure 110 being polarization independent such that the deflector structure 110 may effectively deflect a wide range of wavelengths towards the edge coupler 106. The plurality of photonic crystal structures 606 may, for example, be or comprise silicon nitride, or another dielectric material and has a first refractive index. The first insulator layer 608 may, for example, be or comprise silicon oxynitride, or another dielectric material and has a second refractive index. The second insulator layer 610 may, for example, be or comprise silicon dioxide, or another dielectric material and has a third refractive index. In some embodiments, the first refractive index is greater than the second refractive index, and the third refractive index is less than the second refractive index. For example, in various embodiments, the first refractive index is about 2.0458, the second refractive index is within a range of about 1.46 to about 194, and the third refractive index is about 1.4585.

FIGS. 7A-7C illustrate various views of some embodiments of the deflector structure 110 of FIG. 6G. FIGS. 7A and 7B illustrate various cross-sectional views 700*a* and 700*b* of some embodiments of the deflector structure of FIG. 6G. FIG. 7C illustrates a top view 700*c* of some embodiments of the deflector structure 110 of FIG. 6G.

As illustrated by the cross-sectional view 700*a* of FIG. 7A, the first insulator layer 608 comprises a plurality of insulator segments 702 disposed between adjacent photonic crystal structures 606. In various embodiments, a bottom surface of the plurality of insulator segments 702 is aligned with a bottom surface of the plurality of photonic crystal structures 606. In yet further embodiments, the insulator segments 702 each have a curved upper surface.

As illustrated by the cross-sectional view 700*b* of FIG. 7B, the first insulator layer 608 comprises a plurality of insulator segments 702 disposed between adjacent photonic crystal structures 606. In various embodiments, a top surface of the plurality of insulator segments 702 is aligned with a top surface of the plurality of photonic crystal structures 606. In yet further embodiments, the insulator segments 702 each have a curved lower surface.

As illustrated by the top view 700*c* of FIG. 7A, the photonic crystal structures 606 may be arranged in an array comprising a plurality of rows and columns. In some embodiments, the photonic crystal structures 606 may each have a first shape (e.g., circular) when viewed from the top view (e.g., see FIG. 7C) and a second shape (e.g., rectangular) when viewed in cross-section (e.g., see FIG. 6G, 7A, or 7B).

FIG. 8 illustrates a cross-sectional view of some embodiments of the plurality of optical fibers 210 taken along the line C-C' of FIG. 2. In various embodiments, the upper substrate 202 comprises a plurality of trenches extending into a top surface 202*t* of the upper substrate 202. The trenches may have a triangular shape, where a sidewall of each trench may have an angle 802 relative to the top surface 202*t* of the upper substrate 202. In some embodiments, the angle 802 is about 54°, within a range of about 50° to about 60°, or some other suitable value. In further embodiments, the optical fibers 210 have a circular shape and are disposed within the trenches of the upper substrate 202.

Figure 9:
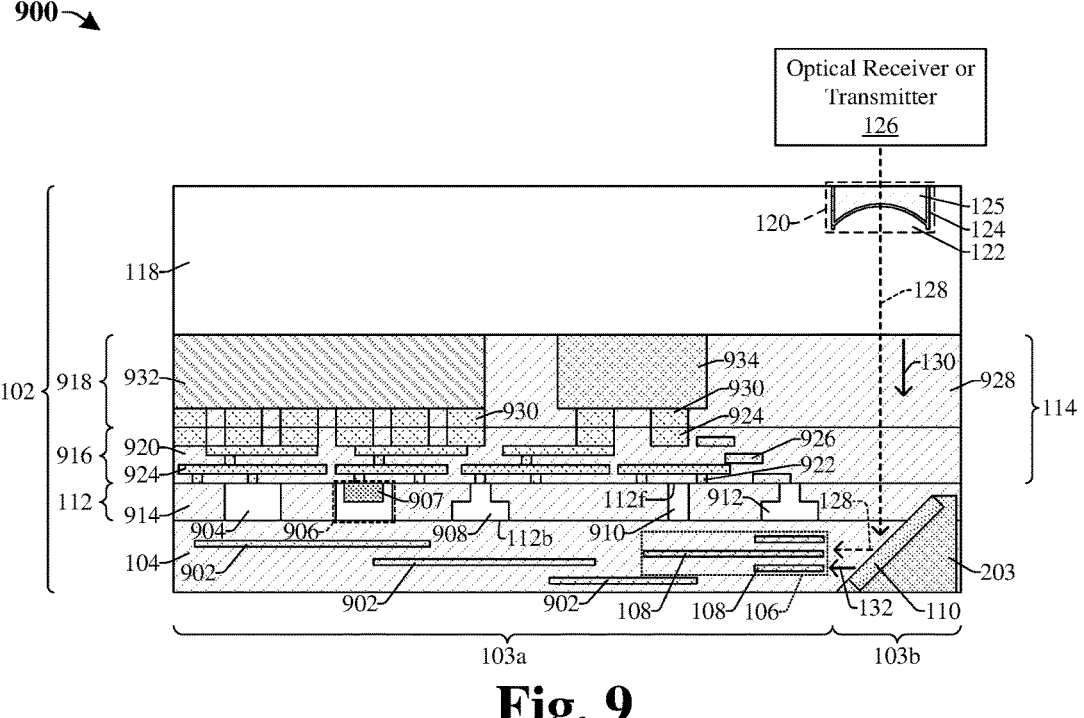
FIG. 9 illustrates a cross-sectional view of some embodiments of an electronic system including a photonic chip that comprises a plurality of photonic devices disposed within an inner device region and a deflector structure disposed within a peripheral region.

FIG. 9 illustrates a cross-sectional view 900 of some embodiments of an electronic system including a photonic chip 102 that comprises a plurality of photonic devices 904-912 disposed within an inner device region 103*a* and a deflector structure 110 disposed within a peripheral region 103*b*.

The photonic chip 102 comprises a lower dielectric structure 104, a first substrate 112, a semiconductor structure 114, and a second substrate 118. In some embodiments, the lower dielectric structure 104 is disposed on a back-side surface 112*b* of the first substrate 112 and the semiconductor structure 114 is disposed on a front-side surface 112*f* of the first substrate 112. The lower dielectric structure 104 may, for example, be or comprise an oxide, such as silicon dioxide, a low-k dielectric material, another dielectric material, or the like. As used herein a low-k dielectric material is a dielectric material with a dielectric constant less than 3.9. In various embodiments, the optical transmitter or receiver 126 is configured to transmit an optical signal 128 in a first direction 130 towards the deflector structure 110. The deflector structure 110 is configured to redirect the transmitted optical signal 128 from the first direction 130 to a second direction 132 towards the edge coupler 106.

A plurality of first waveguides 902 are disposed within the lower dielectric structure 104 and are configured to transmit or carry optical signals (e.g., the optical signal 128) along the second direction 132. The first waveguides 902 may, for example, be or comprise silicon, silicon nitride, another material, or the like. The first waveguides 902 are spaced laterally within the inner device region 103*a* and may be coupled to the optical core segments 108 of the edge coupler 106. In various embodiments, the first waveguides 902 are optically coupled to the edge coupler 106 and are configured to carry or transmit optical signals to or from the edge coupler 106 along the second direction 132.

In some embodiments, the first substrate 112 comprises the plurality of photonic devices 904-912. The photonic devices 904-912 may, for example, be configured to detect optical signals, transfer optical signals, analyze optical signals, generate optical signals, and/or transform optical signals to electrical signals (or vice versa), thereby enabling communication and/or signal processing between the edge coupler 106 and/or the first waveguides 902 and other photonic devices in the electronic system (e.g., the optical transmitter or receiver 126, laser device structure 934, and/or electronic IC structure 932). Further, the photonic devices 904-912 may, for example, be or comprise silicon, polysilicon, monocrystalline silicon, another material, or the like. An insulator structure 914 is disposed between adjacent photonic devices 904-912. In various embodiments, the insulator structure 914 may be configured as an isolation structure (e.g., a shallow trench isolation (STI) structure, a deep trench isolation (DTI) structure, or the like) disposed within the first substrate 112.

In some embodiments, the plurality of photonic devices 904-912 comprises second waveguides 904, 908, 912, a photodetector 906, and an optical core structure 910. The second waveguides 904, 908, 912 overlie the lower dielectric structure 104 and are coupled to the first waveguides 902 and/or the edge coupler 106. In various embodiments, the second waveguides 904, 908, 912 are configured to transmit optical signals to and/or from the first waveguides 902 and/or the edge coupler 106 (e.g., along the first direction 130). In further embodiments, the photodetector 906 may comprise one or more active regions 907 and is configured to convert optical signals (e.g., from the edge coupler 106 and/or the first waveguides 902) into an electrical signal. The photodetector 906 may, for example, be or comprise silicon, germanium, another material, or any combination of the foregoing. For example, the one or more active regions 907 may be or comprise germanium and adjacent regions of the photodetector 906 may be or comprise silicon. In some embodiments, the optical core structure 910 is optically coupled to the edge coupler 106 and is configured to transmit optical signals to and/or from the edge coupler 106 and/or the first waveguides 902.

The semiconductor structure 114 may comprise a first interconnect structure 916 disposed on the first substrate 112 and an upper IC structure 918 disposed between the first interconnect structure 916 and the second substrate 118. In some embodiments, the first interconnect structure 916 comprises an interconnect dielectric structure 920, a plurality of conductive vias 922, a plurality of conductive wires 924, and a plurality of third waveguides 926. The conductive vias 922 and conductive wires 924 are disposed within the interconnect dielectric structure 920 and are configured to electrically coupled devices on the photonic chip 102 to one another. The plurality of third waveguides 926 overlies the plurality of photonic devices 904-912 and may be configured to transmit optical signals to and/or from one or more of the photonic devices 904-912 to overlying devices and/or structures (e.g., the laser device structure 934 and/or the electronic IC structure 932). The plurality of conductive vias and wires 922, 924 may, for example, be or comprise copper, aluminum, titanium nitride, tantalum nitride, ruthenium, tungsten, another conductive material, or any combination of the foregoing. The interconnect dielectric structure 920 may, for example, be or comprise silicon dioxide, a low-k dielectric material, another dielectric material, or any combination of the foregoing. The third waveguides 926 may, for example, be or comprise silicon, silicon nitride, or the like. In various embodiments, the third waveguides 926 may comprise a same material as the first waveguides 902 and the plurality of optical core segments 108.

The upper IC structure 918 overlies the first interconnect structure 916. The upper IC structure 918 comprises the laser device structure 934, the electronic IC structure 932, a plurality of upper conductive wires 930, and/or an upper dielectric structure 928. In some embodiments, the laser device structure 934 is configured to generate and/or modulate a laser beam (e.g., an optical signal) towards the edge coupler 106. In various embodiments, the laser beam is generated by the laser device structure 934 based on or more electrical signals from the electronic IC structure 932 and the laser beam is transmitted to the edge coupler by way of the third waveguides 926 and/or the photonic devices 904-912. In such embodiments, the edge coupler 106 is configured to transmit the laser beam towards the deflector structure 110 and the deflector structure 110 is configured to deflector or redirect the laser beam towards the optical transmitter or receiver 126. The electronic IC structure 932 comprises circuitry or other structures to generate electrical signals to control the laser device structure 934, provide power and/or control signals to the photonic devices 904-912, detect optical signals, modify optical signals, and/or transform optical signals to electrical signals (or vice versa). In various embodiments, the upper conductive wires 930 are configured to electrically couple the first interconnect structure 916 to the laser device structure 934 and/or the electronic IC structure 932.

Figure 10A:
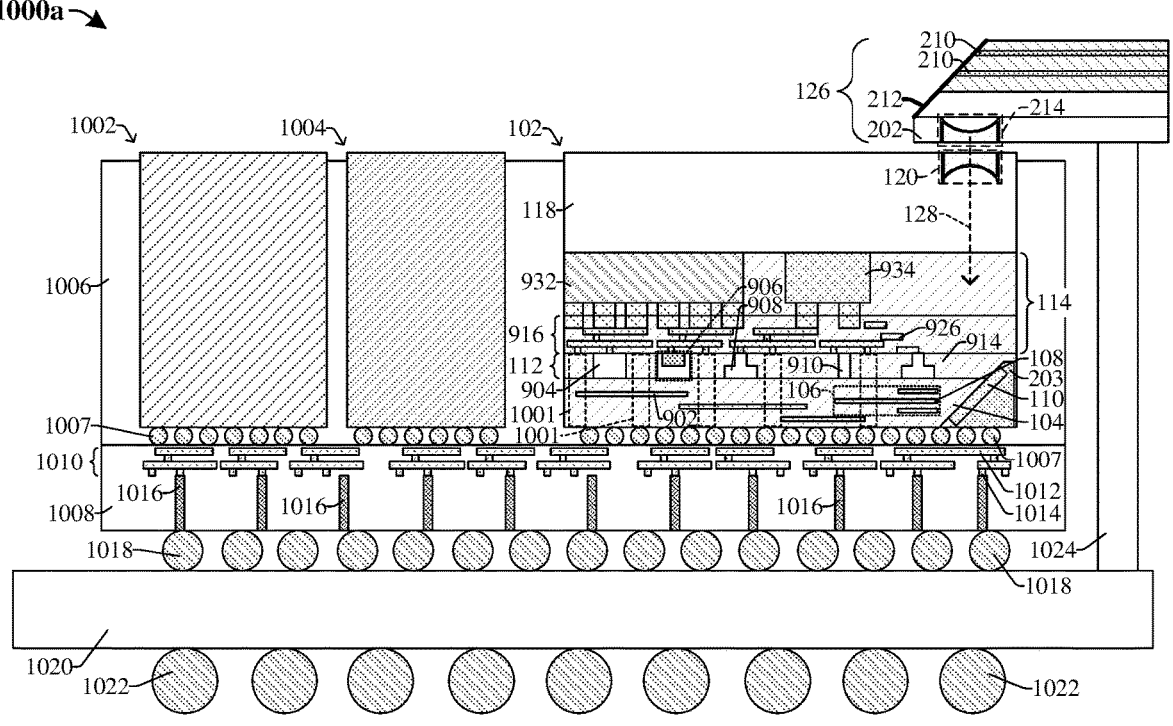
FIGS. 10A-10D and 11 illustrate various cross-sectional views of a package structure comprising a photonic chip electrically coupled to a first integrated circuit (IC) chip and a second IC chip.

FIG. 10A illustrates a cross-sectional view 1000a of some embodiments of a package structure comprising a first integrated circuit (IC) chip 1002, a second IC chip 1004, and a photonic chip 102 disposed over a lower substrate 1020 and electrically coupled to one another. Further, an optical transmitter or receiver 126 overlies and is optically coupled to the photonic chip 102. In various embodiments, the photonic chip 102 may be configured as illustrated and/or described in FIG. 9 and the optical transmitter or receiver 126 may be configured as illustrated and/or described in FIG. 2. Further, the optical transmitter or receiver 126 may be referred to as or configured as a second photonic chip. In further embodiments, the photonic chip 102 comprises a plurality of first through-substrate vias (TSVs) 1001 continuously extending through the lower dielectric structure 104 and the insulator structure 914. The first TSVs 1001 are electrically coupled to the first interconnect structure 916.

The package structure of FIG. 10A comprises an insulating structure 1006, a plurality of first solder bumps 1007, a plurality of metallization layers 1010, a bottom dielectric structure 1008, a plurality of second through-substrate vias (TSVs) 1016, a plurality of second solder bumps 1018, the lower substrate 1020, a support structure 1024, and a plurality of third solder bumps 1022. The insulating structure 1006 wraps around the first IC chip 1002, the second IC chip 1004, and the photonic chip 102, where the insulating structure 1006 adds support for the package structure and insulates the first IC chip 1002, the second IC chip 1004, and the photonic chip 102. The insulating structure 1006 may, for example, be or comprise a molding compound, epoxy, a ceramic material, resin, or any combination of the foregoing. In various embodiments, the support structure 1024 overlies an outer region of the lower substrate 1020 and is configured to provide support for the optical transmitter or receiver 126, such that the second I/O structure 214 of the optical transmitter or receiver 126 overlies the first I/O structure 120 of the photonic chip 102. The lower substrate 1020 may be configured as a printed circuit board (PCB) substrate and may facilitate electrical connections between the first IC chip 1002, the second IC chip 1004, and the photonic chip 102

In some embodiments, the first IC chip 1002 comprises a plurality of memory devices such as, for example, resistive random-access memory (RRAM) cells, phase-change memory (PCM) cells, magnetoresistive random access memory (MRAM) cells, some other suitable semiconductor devices, or any combination of the foregoing. In further embodiments, the second IC chip 1004 comprises a plurality of transistors, a plurality of capacitors, a plurality of diodes, some other suitable semiconductor devices, or any combination of the foregoing and may be configured as an application-specific integrated circuit (ASIC). The plurality of first solder bumps 1007 are disposed between the first IC chip 1002, the second IC chip 1004, and the photonic chip 102 and the plurality of metallization layers 1010. The plurality of metallization layers 1010 comprise a plurality of redistribution wires 1012 and a plurality of redistribution vias 1014 disposed within the bottom dielectric structure 1008. The plurality of redistribution wires 1012 and the plurality of redistribution vias 1014 facilitate electrical connections between the plurality of second TSVs 1016 and the first IC chip 1002, the second IC chip 1004, and the photonic chip 102. The plurality of second solder bumps 1018 is disposed on a top surface of the lower substrate 1020 and the plurality of third solder bumps 1022 is disposed on a bottom surface of the lower substrate 1020.

In various embodiments, the photonic chip 102 is optically coupled to the optical transmitter or receiver 126 and is configured to receive the optical signal 128 from the optical transmitter or receiver 126. Further, the photonic chip 102 comprises circuitry or other structures (e.g., the laser device structure 934, the electronic IC structure 932, the plurality of photonic devices 904-912, the first waveguides 902, the edge coupler 106, and the deflector structure 110, etc.) that can generate optical signals, detect optical signals, analyze optical signals, modify optical signals, transfer optical signals, and/or transform optical signals to electrical signals. Thus, the photonic chip 102 is configured to receive and convert the optical signal 128 from the optical transmitter or receiver 126 to an electrical signal, where the electrical signal may be transmitted to the first IC chip 1002 and/or the second IC chip 1004. In yet further embodiments, the photonic chip 102 may receive electrical signals from the first and/or second IC chip 1002, 1004 and generate corresponding optical signals that are transmitted to the optical transmitter or receiver 126 by way of the edge coupler 106 and the deflector structure 110.

Figure 10B:
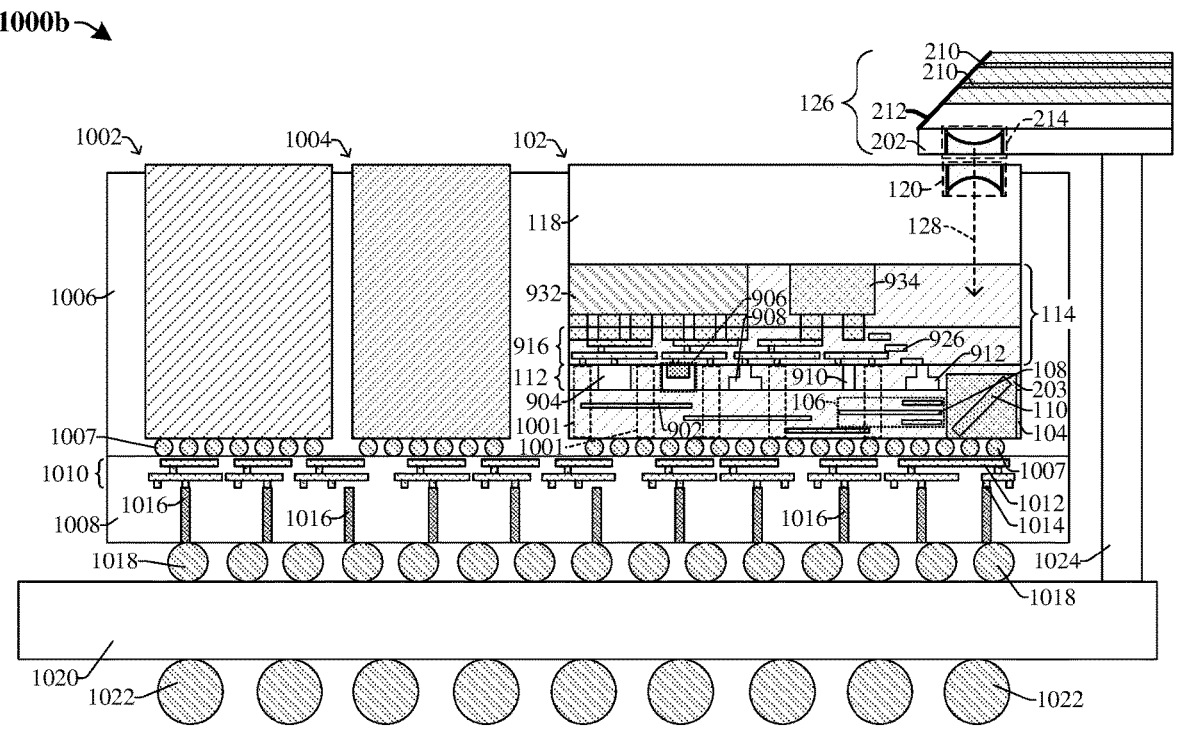

FIG. 10B illustrates a cross-sectional view 1000b of other embodiments of the package structure of FIG. 10A, wherein the lower insulator structure 203 continuously wraps around a perimeter of the deflector structure 110.

Figure 10C:
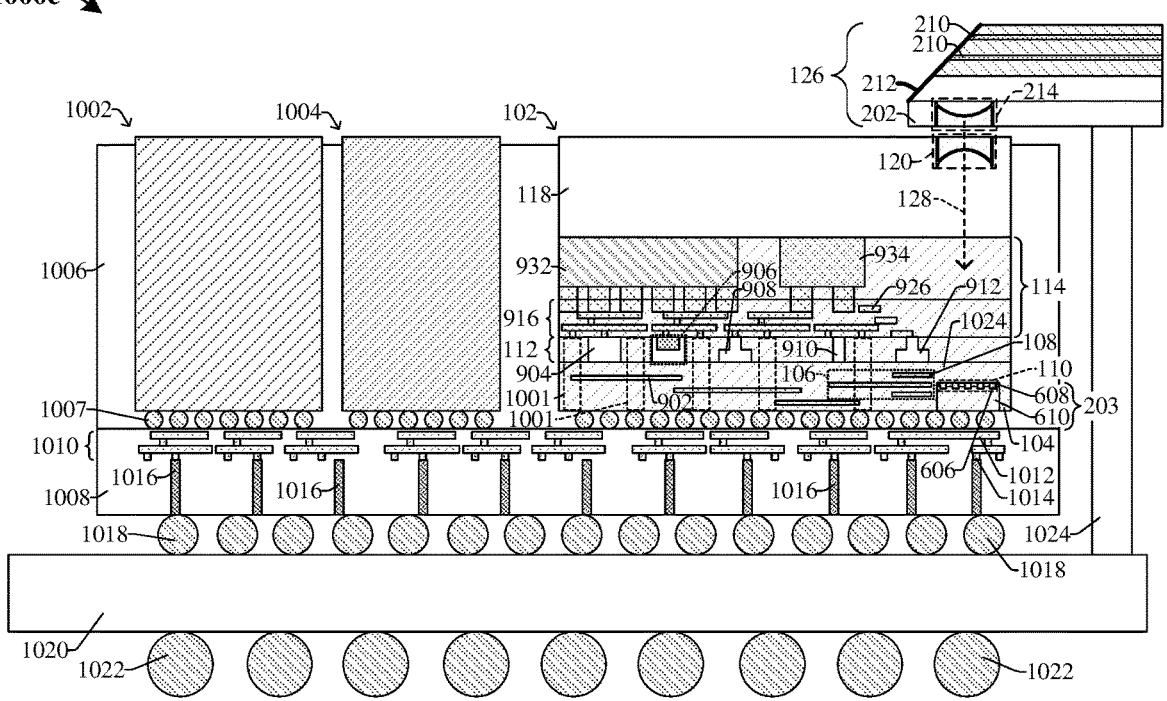

FIG. 10C illustrates a cross-sectional view 1000c of some other embodiments of the package structure of FIG. 10A, wherein the deflector structure 110 comprises a plurality of photonic crystal structures 606.

Figure 10D:
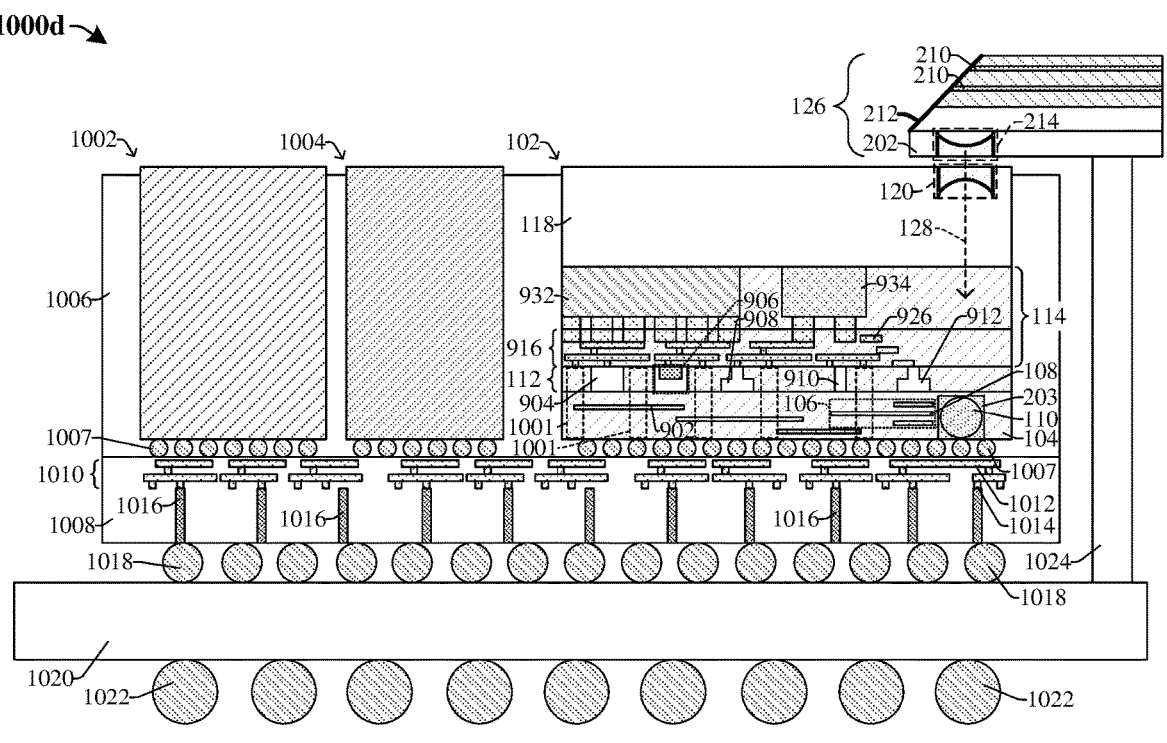

FIG. 10D illustrates a cross-sectional view 1000d of some other embodiments of the package structure of FIG. 10A, wherein the deflector structure 110 has a circular shape.

Figure 11:
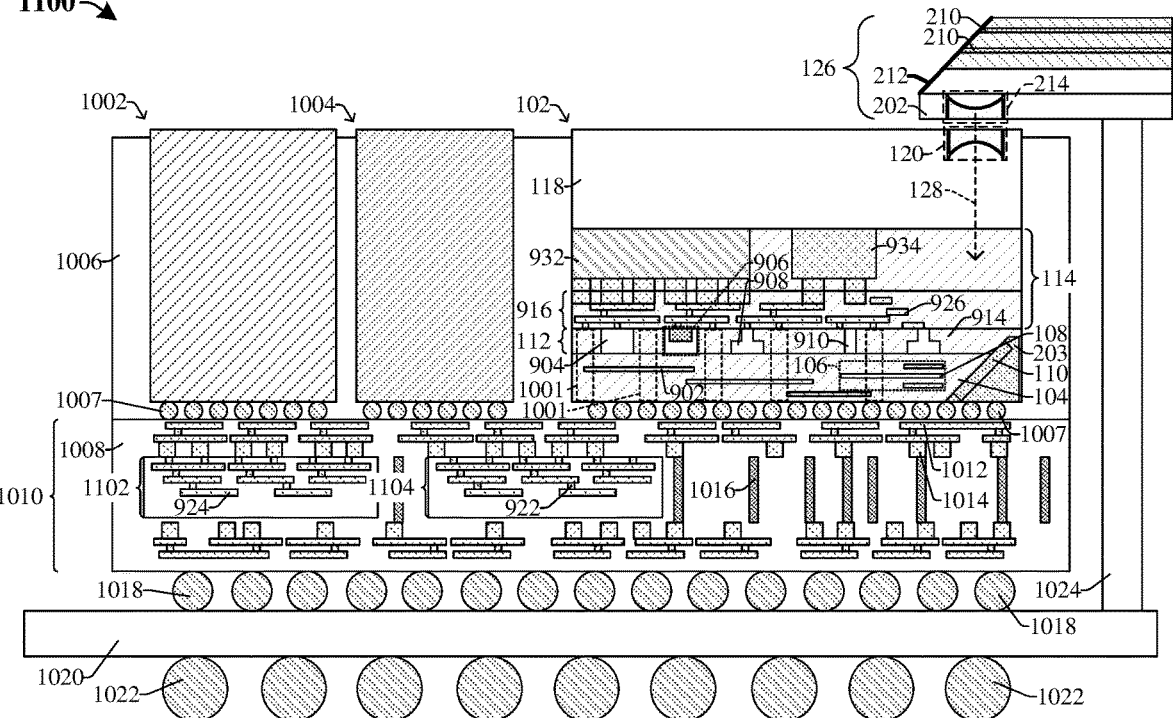

FIG. 11 illustrates a cross-sectional view 1100 of various embodiments of the package structure of FIG. 10A, wherein lower interconnect structures 1102 and 1104 are disposed within the bottom dielectric structure 1008. The lower interconnect structures 1102 and 1104 each comprise a plurality of conductive vias 922 and a plurality of conductive wires 924 that are part of the plurality of metallization layers 1010.

FIGS. 12-24 illustrate cross-sectional views 1200-2400 of some embodiments of a method for forming a photonic chip that comprises a deflector structure laterally adjacent to an edge coupler. Although the cross-sectional views 1200-2400 shown in FIGS. 12-24 are described with reference to a method, it will be appreciated that the structures shown in FIGS. 12-24 are not limited to the method but rather may stand alone separate of the method. Furthermore, although FIGS. 12-24 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 12:
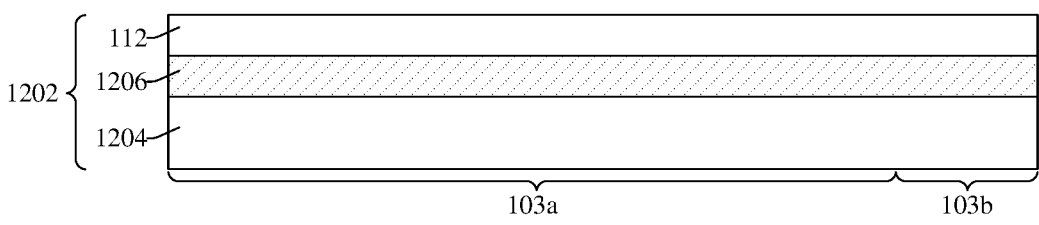
FIGS. 12-24 illustrate cross-sectional views of some embodiments a method for forming a photonic chip that comprises a deflector structure laterally adjacent to an edge coupler.

As shown in cross-sectional view 1200 of FIG. 12, a semiconductor substrate 1202 is provided. The semiconductor substrate 1202 may, for example, be or comprise a silicon-on-insulator (SOI) substrate. The semiconductor substrate 1202 comprises a handle substrate 1204, an insulator layer 1206, and a first substrate 112. In some embodiments, a process for forming the semiconductor substrate 1202 may include: depositing (e.g., by thermal oxidation, physical vapor deposition (PVD), chemical vapor deposition (CVD), etc.) the insulator layer 1206 on the handle substrate 1204; and bonding the first substrate 112 to the insulator layer 1206. In various embodiments, the first substrate 112 may, for example, be or comprise silicon, monocrystalline silicon, bulk silicon, another semiconductor material, or the like.

Figure 13:
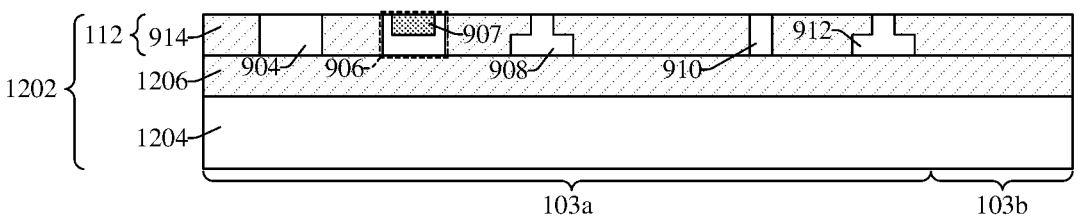

As shown in cross-sectional view 1300 of FIG. 13, a plurality of photonic devices 904-912 is formed within the first substrate 112 and an insulator structure 914 is formed over the handle substrate 1204. The photonic devices 904-912 may, for example, comprise second waveguides 904, 908, 912, a photodetector 906, and an optical core structure 910. Further, the photonic devices 904-912 are formed laterally within an inner device region 103a. In some embodiments, a process for forming the plurality of photonic devices 904-912 includes performing one or more patterning process(es) on the first substrate 112, performing one or more deposition process(es), performing one or more selective ion implantation process(es), or the like. In some embodiments, the one or more patterning process(es) includes: forming a patterned masking layer (not shown) over the first substrate 112; exposing unmasked regions of the first substrate 112 to one or more etchants; and performing a removal process to remove the patterned masking layer. The insulator structure 914 may be formed by depositing the insulator structure 914 over the handle substrate 1204 by, for example, a PVD process, a CVD process, an atomic layer deposition (ALD) process, or another suitable deposition or growth process. In further embodiments, a planarization process (e.g., a chemical mechanical planarization (CMP) process) may be performed on the first substrate 112 and the insulator structure 914 such that top surfaces of the photonic devices 904-912 are co-planar with a top surface of the insulator structure 914.

Figure 14:
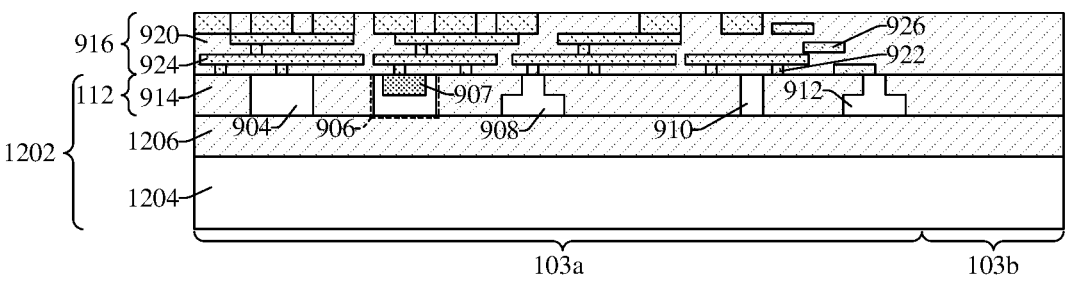

As shown in cross-sectional view 1400 of FIG. 14, a first interconnect structure 916 is formed over the first substrate 112. The first interconnect structure 916 comprises an interconnect dielectric structure 920, a plurality of conductive vias 922, a plurality of conductive wires 924, and a plurality of third waveguides 926. The first interconnect structure 916 may be formed by one or more patterning process(es), one or more deposition process(es), one or more selective ion implantation process(es), some other suitable fabrication process(es), or any combination of the foregoing.

Figure 15:
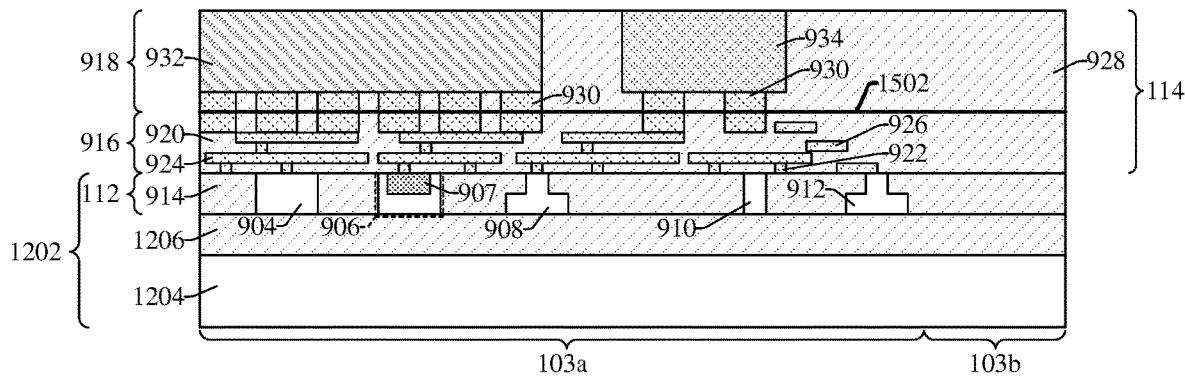

As shown in cross-sectional view 1500 of FIG. 15, an upper IC structure 918 is provided and bonded to the first interconnect structure 916, thereby defining a semiconductor structure 114. In various embodiments, the upper IC structure 918 comprises a laser device structure 934, an electronic IC structure 932, a plurality of upper conductive wires 930, and an upper dielectric structure 928. The upper IC structure 918 meets the first interconnect structure 916 at a bond interface 1502. In some embodiments, the upper IC structure 918 is bonded to the first interconnect structure 916 by a fusion bonding process, a eutectic bonding process, a hybrid bonding process, or some other suitable bonding process.

15                                                      16

Figure 16:
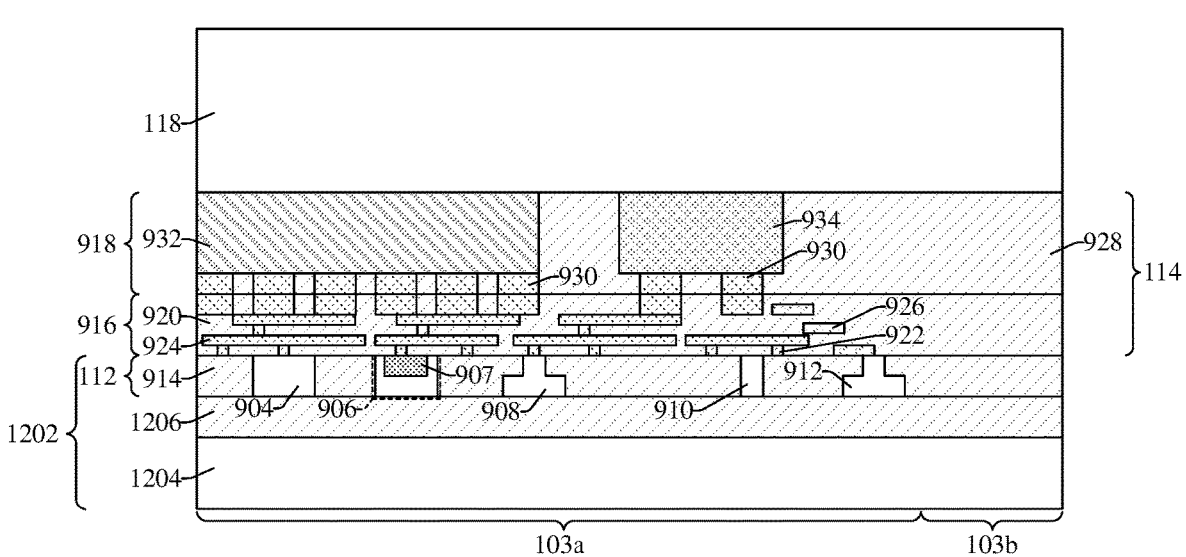

As shown in cross-sectional view 1600 of FIG. 16, a second substrate 118 is bonded to the upper IC structure 918. In various embodiments, the second substrate 118 is bonded to the upper IC structure 918 by a fusion bonding process, a eutectic bonding process, a hybrid bonding process, or some other suitable bonding process.

Figure 17:
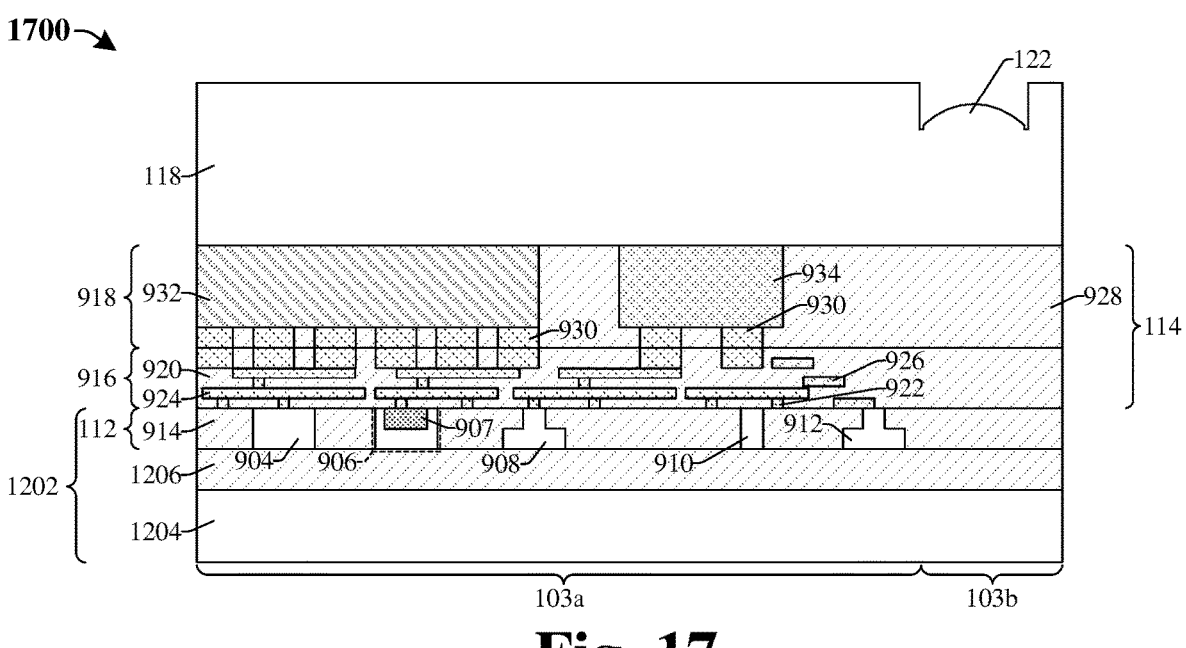

As shown in cross-sectional view 1700 of FIG. 17, a first lens 122 is formed in the second substrate 118 laterally within a peripheral region 103*b*, where the peripheral region 103*b* is adjacent to the inner device region 103*a*. In various embodiments, a process for forming the first lens 122 includes forming a masking layer (not shown) over the second substrate 118; exposing the second substrate 118 to one or more etchants; and performing a removal process to remove the masking layer. The first lens 122 is formed such that the first lens 122 comprises a curved upper surface. In yet further embodiments, a process for forming the first lens 122 may include: patterning a lens template (not shown) having a curved upper surface above the second substrate 118, where the lens template may comprise a photoresist material exposed using a distributed exposing light dose (e.g., for a negative photoresist more light is exposed at a bottom of the curvature and less light is exposed at a top of the curvature), developed and baked to form a rounding shape; and selectively etching the second substrate 118 according to the lens template.

Figure 18:
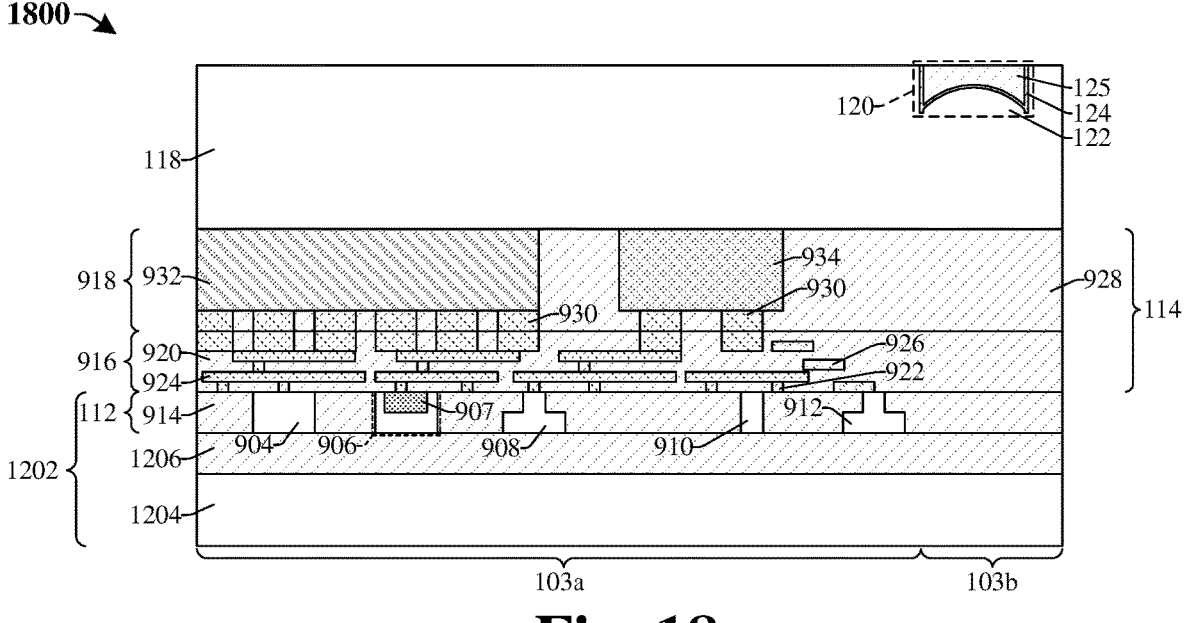

As shown in cross-sectional view 1800 of FIG. 18, a first liner structure 124 is formed over the first lens 122 and a first insulator layer 125 is formed over the first liner structure 124, thereby defining a first I/O structure 120. In some embodiments, the first liner structure 124 may be deposited on the first lens 122 by a PVD process, a CVD process, an ALD process, or some other suitable growth or deposition process. In further embodiments, the first insulator layer 125 may be deposited on the first liner structure 124 by a PVD process, a CVD process, an ALD process, or some other suitable growth or deposition process. In yet further embodiments, a planarization process (e.g., a CMP process) may be performed on the first liner structure 124 and the first insulator layer 125 such that top surfaces of the first liner structure 124 and the first insulator layer 125 are co-planar with a top surface of the second substrate 118.

Figures 19, 20:
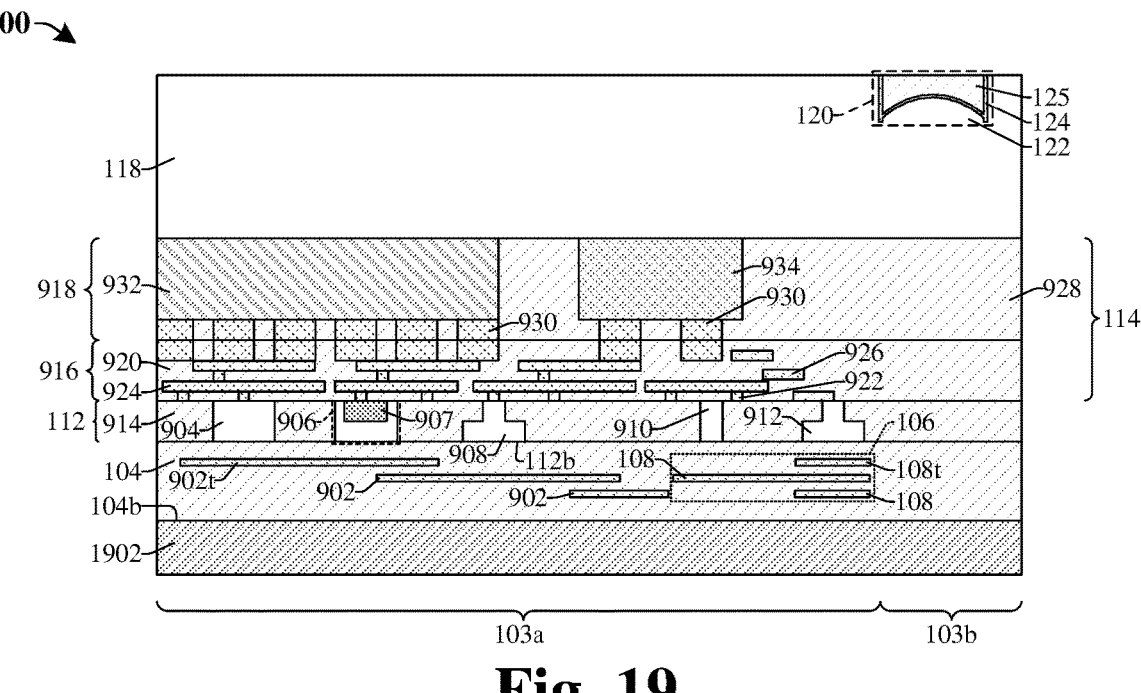

As shown in cross-sectional view 1900 of FIG. 19, a removal process is performed to remove the handle substrate (1204 of FIG. 18) and the insulator layer (1206 of FIG. 18). Further, a lower dielectric structure 104, a plurality of first waveguides 902, and an edge coupler 106 are formed along a back-side surface 112*b* of the first substrate 112. Furthermore, a masking layer 1902 is formed along a back-side 104*b* of the lower dielectric structure 104. The masking layer 1902 may be a hard mask layer, a photoresist, or the like.

In some embodiments, the lower dielectric structure 104 may be deposited on the back-side surface 112*b* of the first substrate 112 by a CVD process, a PVD process, an ALD process, or some other suitable deposition or growth process. In further embodiments, a process for forming the first waveguides 902 and the edge coupler 106 may include: depositing (e.g., by CVD, PVD, ALD, etc.) an optical device layer (e.g., comprising silicon, silicon nitride, or the like) on the lower dielectric structure 104 and/or the first substrate 112; forming a masking layer (not shown) on the optical device layer; patterning the optical device layer according to the masking layer; and removing the masking layer. In various embodiments, the edge coupler 106 comprises a plurality of optical core segments 108. The plurality of optical core segments 108 are vertically stacked over one another in a plurality of layers. In some embodiments, each optical core segment 108 may be formed concurrently with a corresponding first waveguide 902. For example, a top-most first waveguide 902*t* may be formed concurrently with a topmost optical core segment 108*t*.

As shown in cross-sectional view 2000 of FIG. 20, the masking layer 1902 is patterned or developed to form an opening 2002 in the masking layer 1902 within the peripheral region 103*b*.

Figures 21, 22:
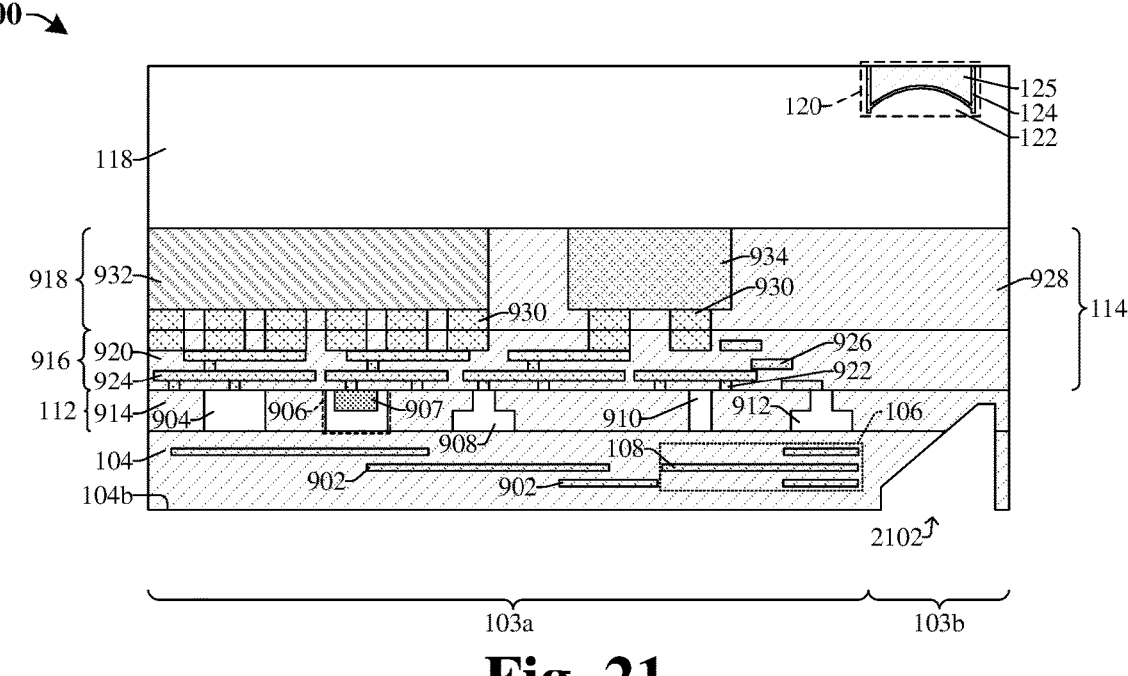

As shown in cross-sectional view 2100 of FIG. 21, an etching process is performed into the back-side 104*b* of the lower dielectric structure 104 to form a deflector opening 2102 extending into the lower dielectric structure 104 and the insulator structure 914. The deflector opening 2102 is disposed laterally within the peripheral region 103*b* and directly underlies the first I/O structure 120. In some embodiments, the etching process includes: exposing the lower dielectric structure 104 and the insulator structure 914 to one or more etchants(s) (e.g., wet etchant(s), dry etchant(s), or any combination of the foregoing) with the masking layer (1902 of FIG. 20) in place; and performing a removal process to remove the masking layer (1902 of FIG. 20). In various embodiments, the etching process includes performing a wet etch, a dry etch, or a combination of the foregoing. In yet further embodiments, an upper portion of the deflector opening 2102 is defined by an upper surface of the lower dielectric structure 104 and an upper surface of the insulator structure 914 that are slanted relative to the back-side 104*b* of the lower dielectric structure 104.

As shown in cross-sectional view 2200 of FIG. 22, a deflector structure 110 and a lower insulator structure 203 are formed within the deflector opening (2102 of FIG. 21), thereby defining the photonic chip 102. In various embodiments, the deflector structure 110 is formed in the deflector opening (2102 of FIG. 21) by a sputtering process, a CVD process, a PVD process, an ALD process, an electroplating process, or some other suitable deposition or growth process. Further, the lower insulator structure 203 is formed on the deflector structure 110 by a PVD process, a CVD process, an ALD process, or some other suitable deposition or growth process. In various embodiments, a planarization process (e.g., a CMP process) may be performed on the lower insulator structure 203 such that a back-side 104*b* of the lower dielectric structure 104 is co-planar with a bottom surface of the lower insulator structure 203. In some embodiments, the deflector structure 110 may, for example, be or comprise a metal material (e.g., copper, aluminum, tantalum, aluminum copper, aluminum copper silicon, etc.), a dielectric material (e.g., silicon nitride, silicon dioxide, titanium oxide, aluminum oxide, etc.), some other reflective material, or any combination of the foregoing.

In various embodiments, the deflector structure 110 may comprise a plurality of deflector layers (e.g., as illustrated and/or described in FIG. 6A) that may each be formed by an individual deposition process (not shown). In such embodiments, a first deposition process (e.g., CVD, PVD, ALD, etc.) is performed to form a first deflector layer (e.g., 602 of FIG. 6A) in the deflector opening (2102 of FIG. 21), a second deposition process (e.g., CVD, PVD, ALD, etc.) is performed to form a second deflector layer (e.g., 604 of FIG. 6A) in the deflector opening (2102 of FIG. 21), and so on.

Figure 23:
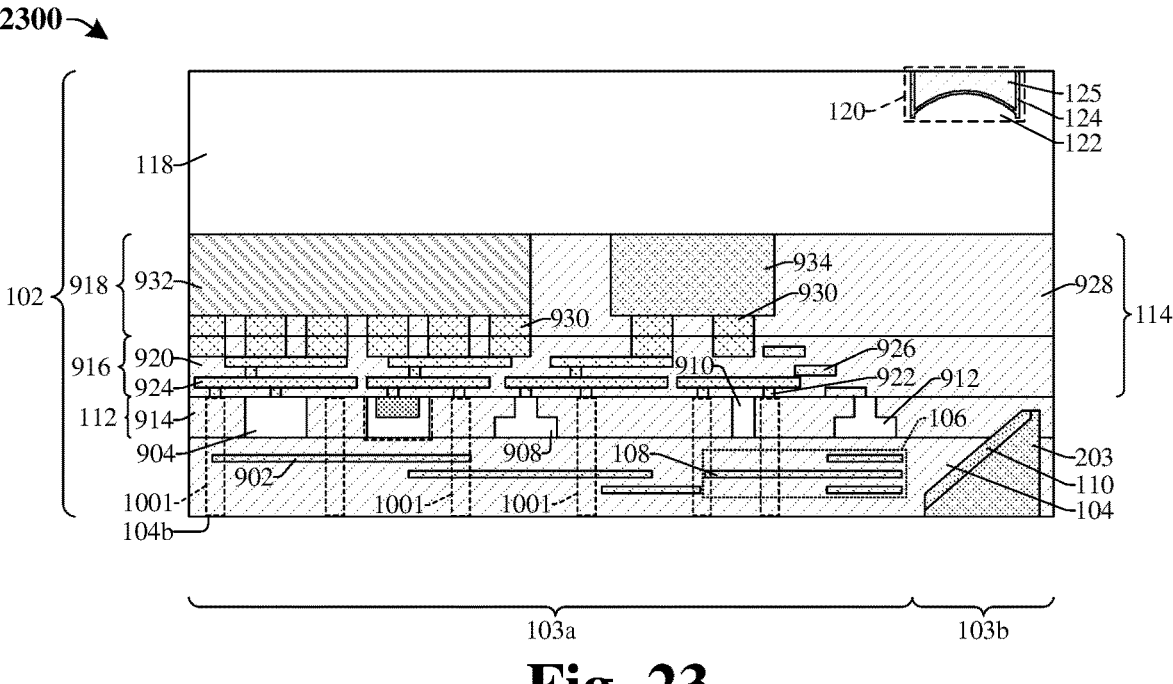

As shown in cross-sectional view 2300 of FIG. 23, a plurality of first through-substrate vias (TSVs) 1001 is formed within the lower dielectric structure 104 and the first substrate 112. The first TSVs 1001 are illustrated by dashed boxes and are formed in areas of the photonic chip 102 laterally offset from the plurality of photonic devices 904-

912, the plurality of first waveguides 902, and the edge coupler 106. In some embodiments, a process for forming the plurality of first TSVs 1001 includes: patterning a back-side 104b of the lower dielectric structure 104 to form a plurality of TSVs openings in the lower dielectric structure 104 and the insulator structure 914; depositing a conductive material within the plurality of TSVs openings; and performing a planarization process (e.g., a CMP process) into the conductive material.

Figure 24:
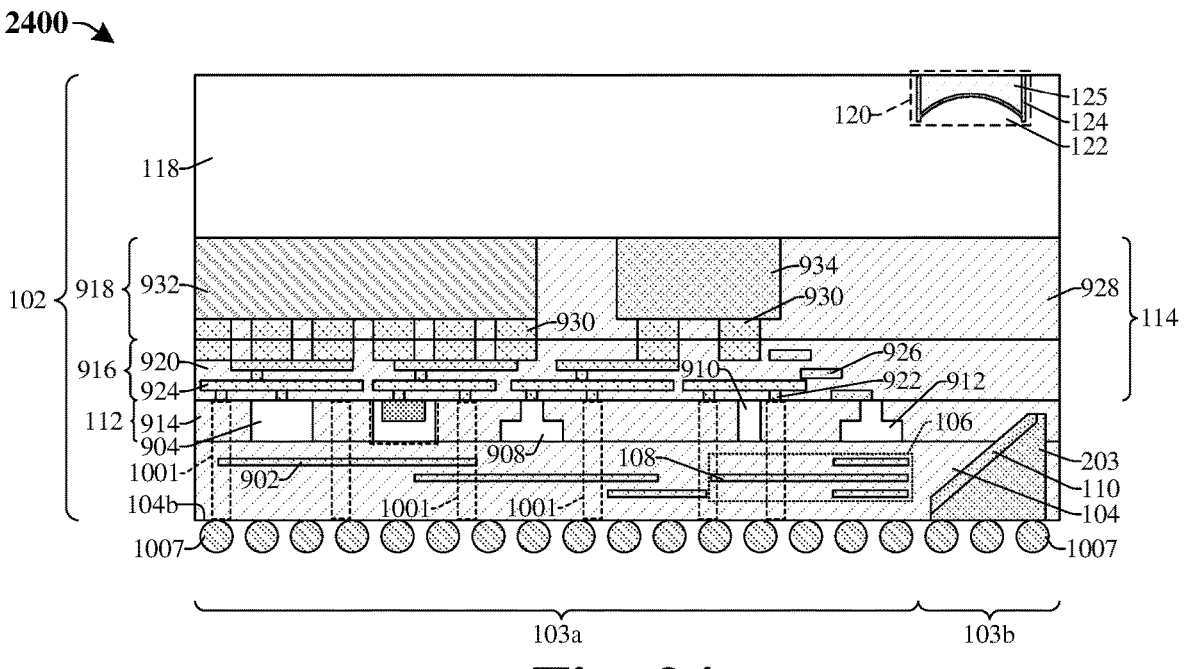

As shown in cross-sectional view 2400 of FIG. 24, a plurality of first solder bumps 1007 is formed along the back-side 104b of the lower dielectric structure 104.

FIG. 25 illustrates a method 2500 of some embodiments for forming a photonic chip that comprises a deflector structure laterally adjacent to an edge coupler. Although the method 2500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2502, a semiconductor substrate is provided, where the semiconductor substrate comprises an insulator layer disposed over a handle substrate and a first substrate on the insulator layer. FIG. 12 illustrates cross-sectional view 1200 corresponding to various embodiments of act 2502.

At act 2504, a plurality of photonic devices is formed in the first substrate laterally within an inner device region. FIG. 13 illustrates cross-sectional view 1300 corresponding to various embodiments of act 2504.

At act 2506, an insulator structure is formed around the photonic devices. FIG. 13 illustrates cross-sectional view 1300 corresponding to various embodiments of act 2506.

At act 2508, a first interconnect structure is formed over the plurality of photonic devices. FIG. 14 illustrates cross-sectional view 1400 corresponding to various embodiments of act 2508.

At act 2510, an upper IC structure is bonded to the first interconnect structure, where the upper IC structure comprises a laser device structure and an electronic IC structure. FIG. 15 illustrates cross-sectional view 1500 corresponding to various embodiments of act 2510.

At act 2512, a second substrate is formed on the upper IC structure. FIG. 16 illustrates cross-sectional view 1600 corresponding to various embodiments of act 2512.

At act 2514, a first input/output (I/O) structure is formed in the second substrate, where the first I/O structure is disposed laterally within a peripheral region. FIGS. 17 and 18 illustrate cross-sectional views 1700 and 1800 corresponding to various embodiments of act 2514.

At act 2516, a removal process is performed to remove the handle substrate and the insulator layer. FIG. 19 illustrates cross-sectional view 1900 corresponding to various embodiments of act 2516.

At act 2518, a lower dielectric structure, a plurality of first waveguides, and an edge coupler are formed on a back-side surface of the first substrate, where the edge coupler is disposed in the inner device region and is laterally adjacent to the peripheral region. FIG. 19 illustrates cross-sectional view 1900 corresponding to various embodiments of act 2518.

At act 2520, a deflector opening is formed within the lower dielectric structure and/or the insulator structure, where the deflector opening is disposed in the peripheral region and directly underlies the first I/O structure. FIGS. 19-21 illustrate cross-sectional view 1900-2100 corresponding to various embodiments of act 2520.

At act 2522, a deflector structure is formed in the deflector opening, where the deflector structure is adjacent to the edge coupler. FIG. 22 illustrates cross-sectional view 2200 corresponding to various embodiments of act 2522.

At act 2524, a plurality of through-substrate vias (TSVs) are formed extending through the lower dielectric structure and the insulator structure. FIG. 23 illustrates cross-sectional view 2300 corresponding to various embodiments of act 2524.

At act 2526, a plurality of solder bumps is formed along a back-side of the lower dielectric structure. FIG. 24 illustrates cross-sectional view 2400 corresponding to various embodiments of act 2526.

Figure 26:
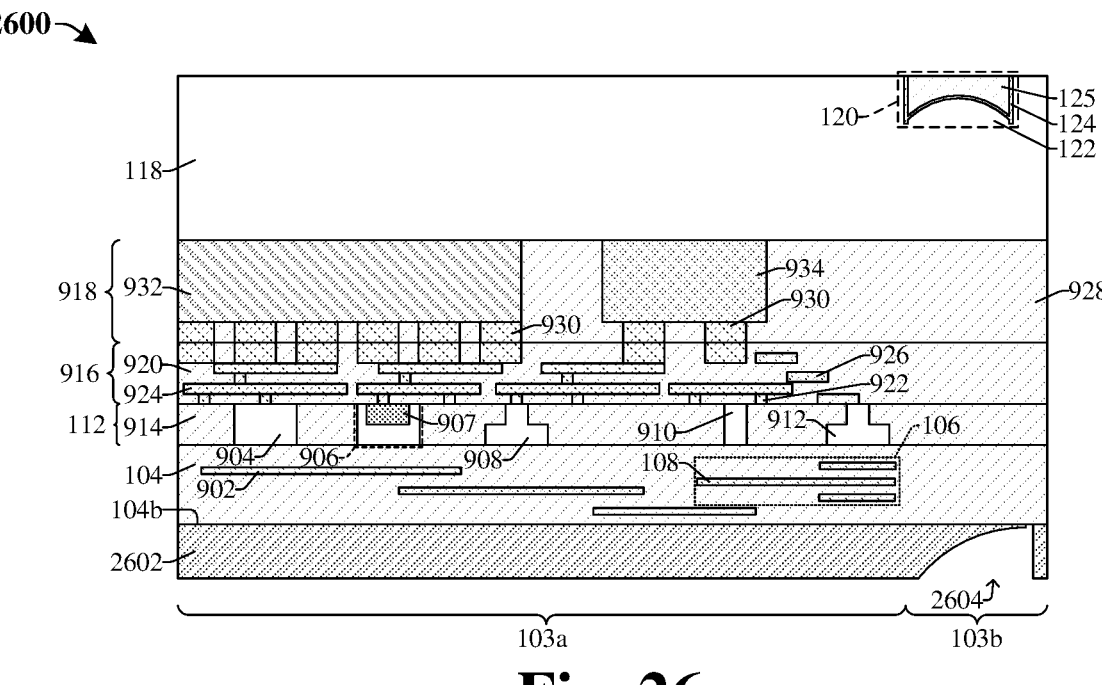
FIGS. 26-28 illustrate cross-sectional views of further embodiments of a method for forming a photonic chip that comprises a deflector structure laterally adjacent to an edge coupler.
Figure 27:
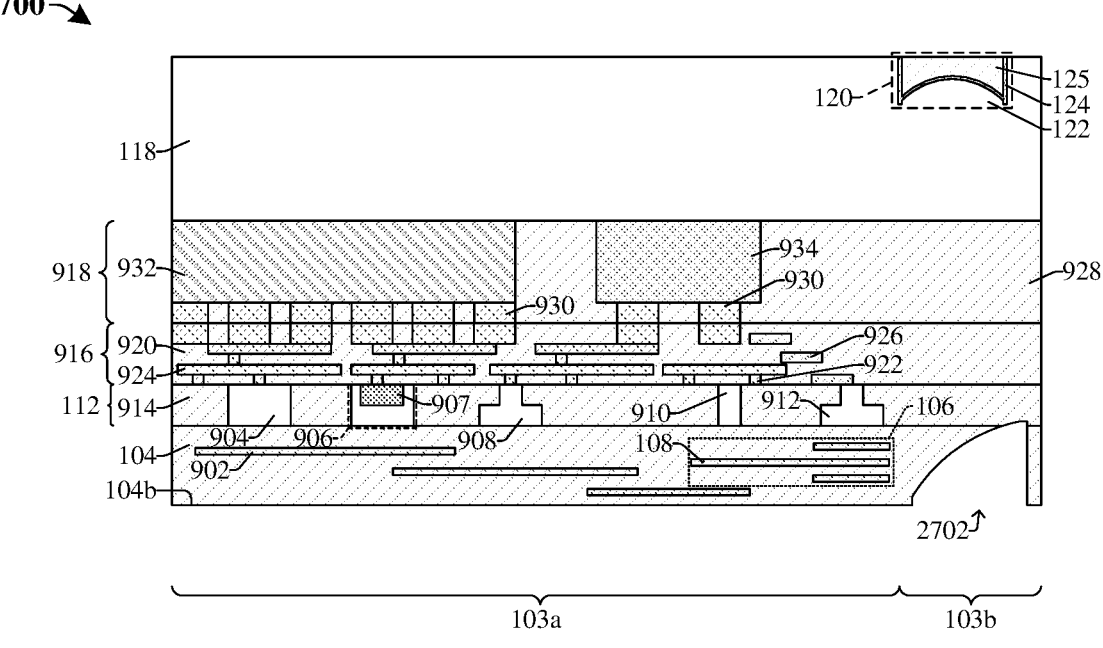
Figure 28:
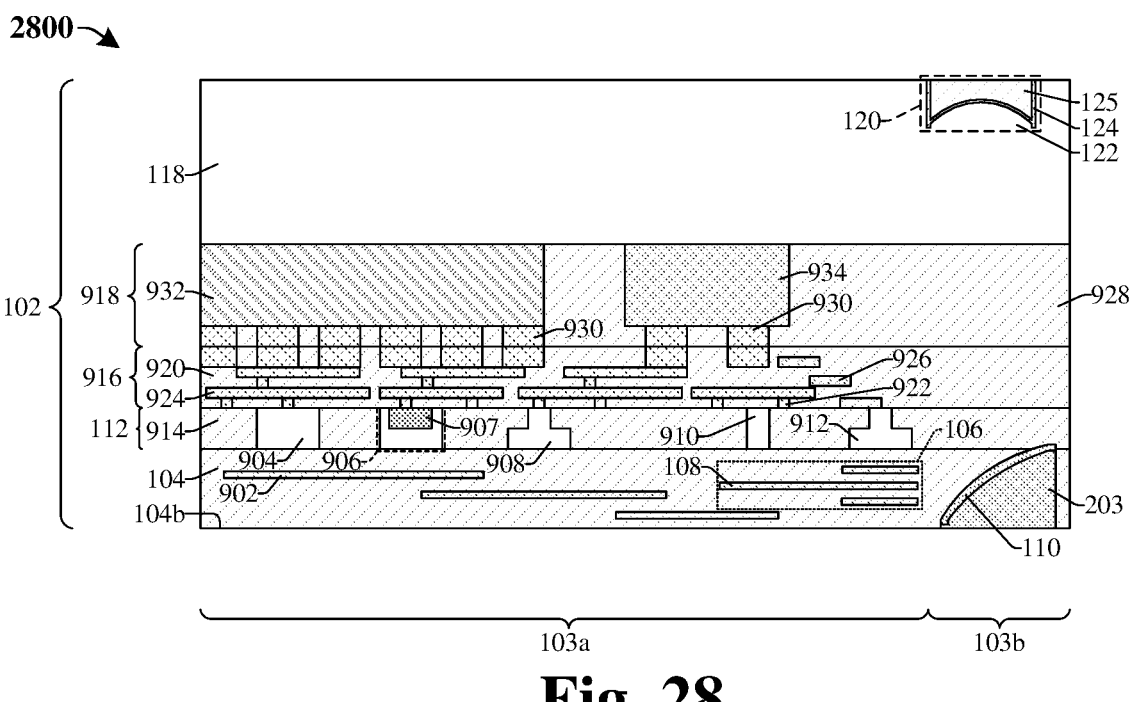

FIGS. 26-28 illustrate cross-sectional views 2600-2800 of some embodiments of acts that may be performed in place of the acts at FIGS. 20-22, such that the method of FIGS. 12-24 may alternatively proceed from FIGS. 12-19 to FIGS. 26-28 and then from FIG. 28 to FIGS. 23 and 24 (i.e., skipping FIGS. 20-22).

As shown in cross-sectional view 2600 of FIG. 26, the masking layer 1902 is patterned or developed to form an opening 2602 in the masking layer 1902 within the peripheral region 103b. In various embodiments, the masking layer 1902 is patterned or developed such that the masking layer 1902 has a curved surface at least in part defining the opening 2602.

As shown in cross-sectional view 2700 of FIG. 27, an etching process is performed into the back-side 104b of the lower dielectric structure 104 to form a deflector opening 2702 extending into the lower dielectric structure 104 and the insulator structure 914. The deflector opening 2702 is disposed laterally within the peripheral region 103b and directly underlies the first I/O structure 120. In some embodiments, the etching process includes: exposing the lower dielectric structure 104 and the insulator structure 914 to one or more etchants(s) (e.g., wet etchant(s), dry etchant(s), or any combination of the foregoing) with the masking layer (1902 of FIG. 26) in place; and performing a removal process to remove the masking layer (1902 of FIG. 26). In various embodiments, the etching process includes performing a wet etch, a dry etch, or a combination of the foregoing. In yet further embodiments, an upper portion of the deflector opening 2702 is defined by an upper surface of the lower dielectric structure 104 and an upper surface of the insulator structure 914 that are curved.

As shown in cross-sectional view 2800 of FIG. 28, a deflector structure 110 and a lower insulator structure 203 are formed within the deflector opening (2702 of FIG. 27). In various embodiments, the deflector structure 110 is formed in the deflector opening (2702 of FIG. 27) by a sputtering process, a CVD process, a PVD process, an ALD process, an electroplating process, or some other suitable deposition or growth process. In some embodiments, the deflector structure 110 is formed such that the deflector structure 110 comprises an upper surface curved towards sidewalls of the optical core segments 108. Further, the lower insulator structure 203 is formed on the deflector structure 110 by a PVD process, a CVD process, an ALD process, or some other suitable deposition or growth process. In various embodiments, a planarization process (e.g., a CMP process) may be performed on the lower insulator structure 203 such that the back-side 104*b* of the lower dielectric structure 104 is co-planar with a bottom surface of the lower insulator structure 203. In some embodiments, the deflector structure 110 may, for example, be or comprise copper, aluminum, tantalum, aluminum copper, aluminum copper silicon, some other reflective material, or any combination of the foregoing.

Figure 29:
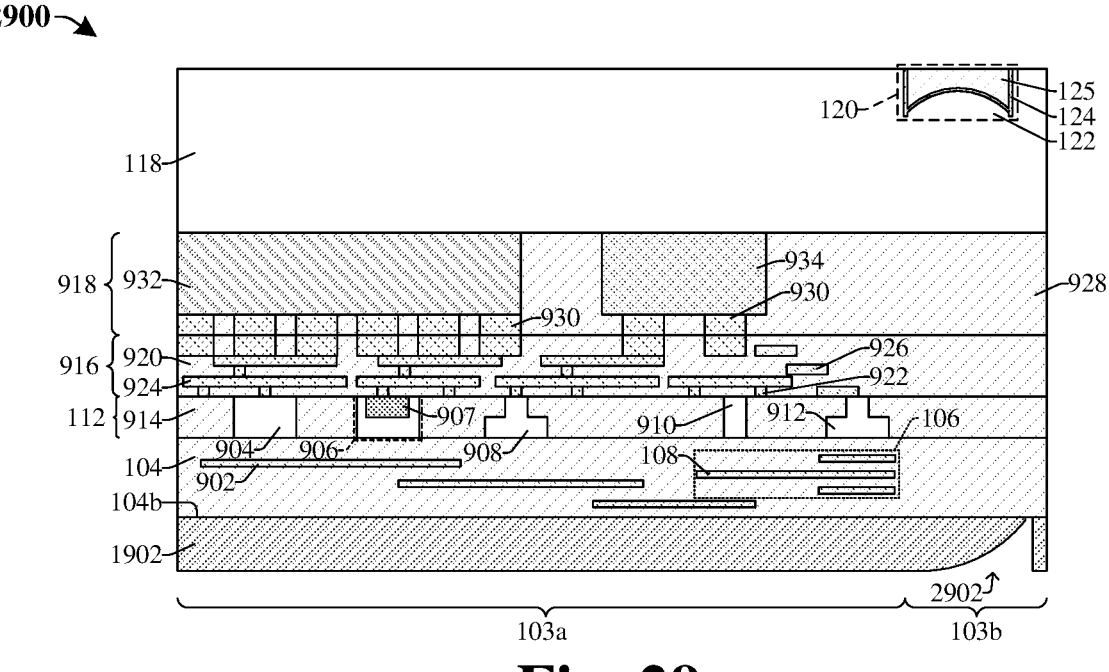
FIGS. 29-31 illustrate cross-sectional views of yet further embodiments of a method for forming a photonic chip that comprises a deflector structure laterally adjacent to an edge coupler.
Figure 30:
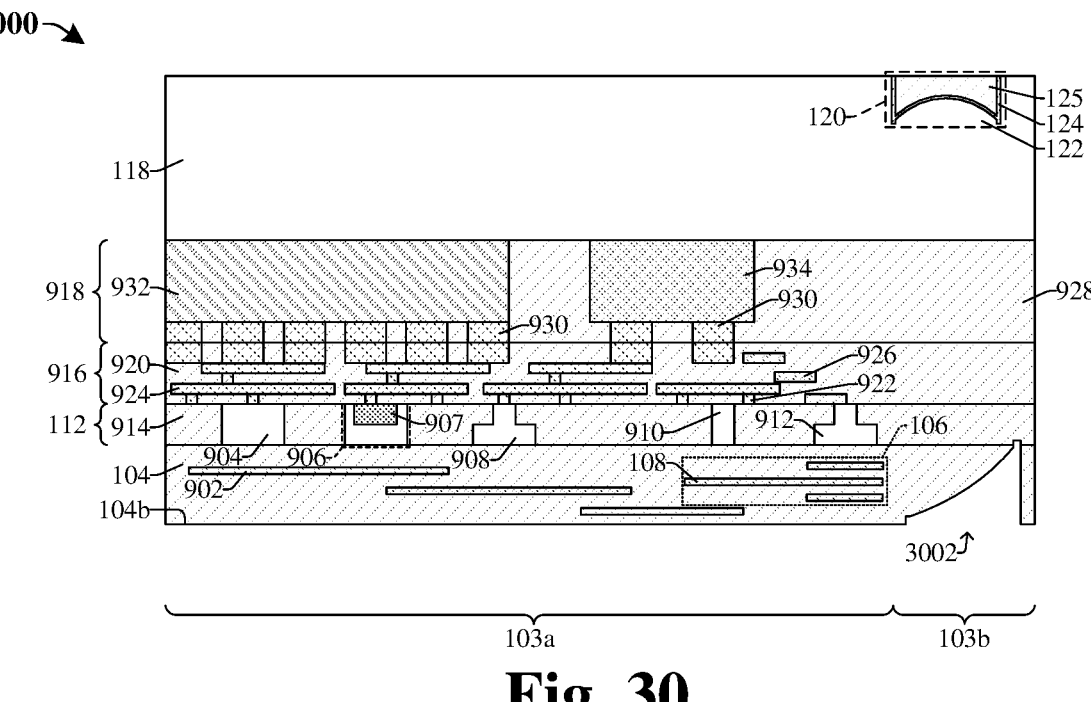
Figure 31:
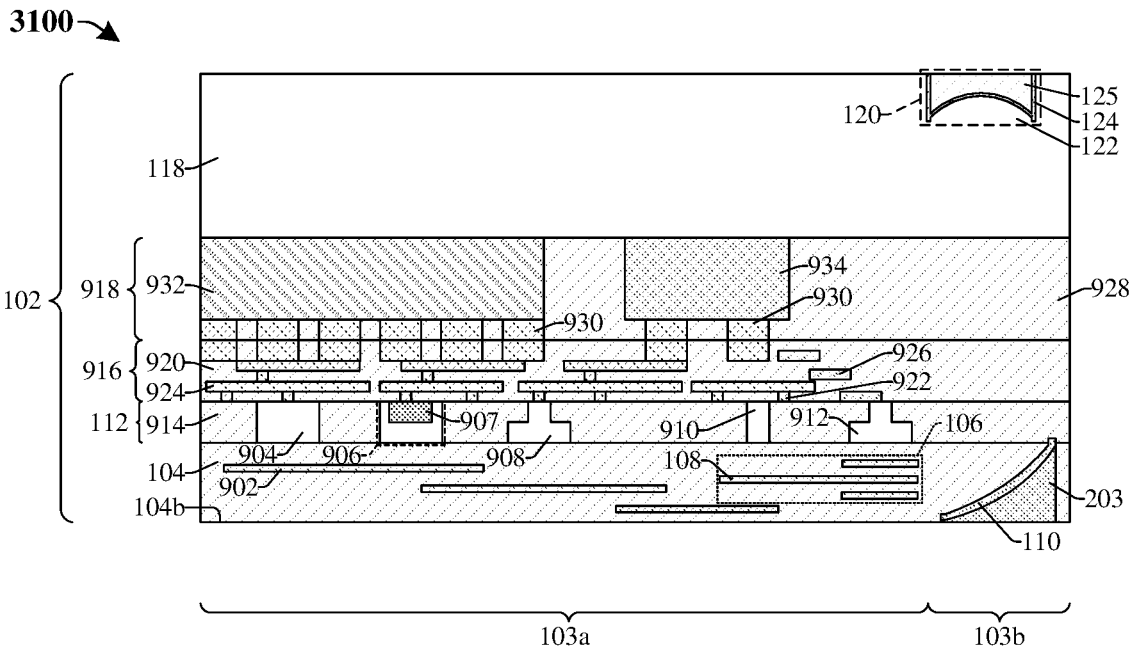
Figure 32:
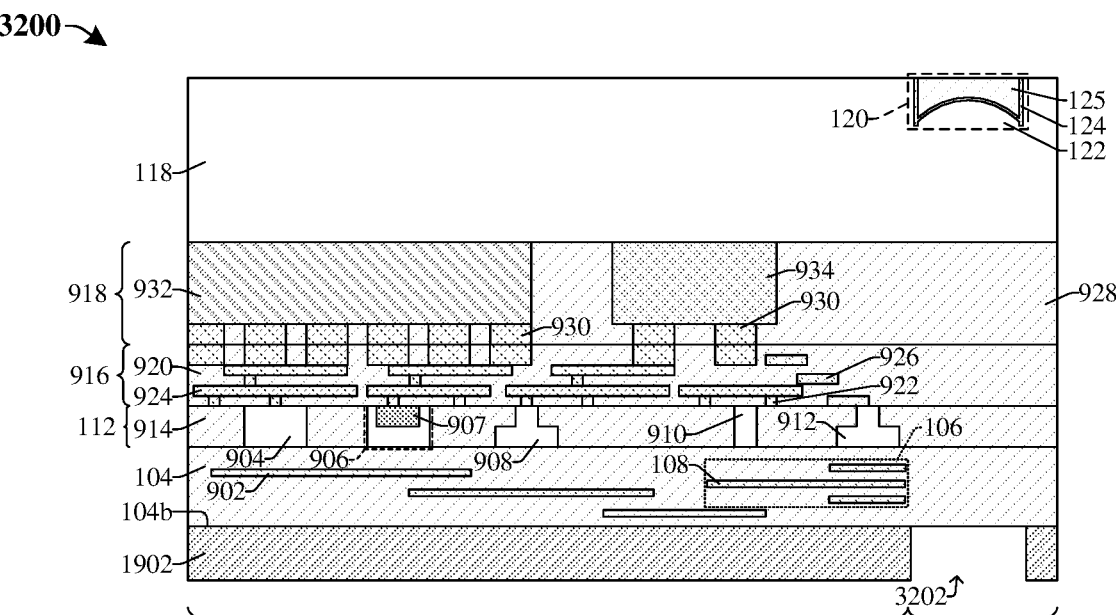
FIGS. 32-35 illustrate cross-sectional views of other embodiments of a method for forming a photonic chip that comprises a deflector structure laterally adjacent to an edge coupler.

FIGS. 29-31 illustrate cross-sectional views 2900-3100 of some embodiments of acts that may be performed in place of the acts at FIGS. 20-22, such that the method of FIGS. 12-24 may alternatively proceed from FIGS. 12-19 to FIGS. 29-31 and then from FIG. 31 to FIGS. 23 and 24 (i.e., skipping FIGS. 20-22).

As shown in cross-sectional view 2900 of FIG. 29, the masking layer 1902 is patterned or developed to form an opening 2902 in the masking layer 1902 within the peripheral region 103*b*.

As shown in cross-sectional view 3000 of FIG. 30, an etching process is performed into the back-side 104*b* of the lower dielectric structure 104 to form a deflector opening 3002 extending into the lower dielectric structure 104 and/or the insulator structure 914. In some embodiments, the etching process includes: exposing the lower dielectric structure 104 and the insulator structure 914 to one or more etchants(s) (e.g., wet etchant(s), dry etchant(s), or any combination of the foregoing) with the masking layer (1902 of FIG. 29) in place; and performing a removal process to remove the masking layer (1902 of FIG. 29). In various embodiments, the etching process includes performing a wet etch, a dry etch, or a combination of the foregoing.

As shown in cross-sectional view 3100 of FIG. 31, a deflector structure 110 and a lower insulator structure 203 are formed within the deflector opening (3002 of FIG. 30). In various embodiments, the deflector structure 110 is formed in the deflector opening (3002 of FIG. 30) by a sputtering process, a CVD process, a PVD process, an ALD process, an electroplating process, or some other suitable deposition or growth process. Further, the lower insulator structure 203 is formed on the deflector structure 110 by a PVD process, a CVD process, an ALD process, or some other suitable deposition or growth process. In various embodiments, a planarization process (e.g., a CMP process) may be performed on the lower insulator structure 203 such that the back-side 104*b* of the lower dielectric structure 104 is co-planar with a bottom surface of the lower insulator structure 203. In some embodiments, the deflector structure 110 may, for example, be or comprise copper, aluminum, tantalum, aluminum copper, aluminum copper silicon, some other reflective material, or any combination of the foregoing.

Figure 33:
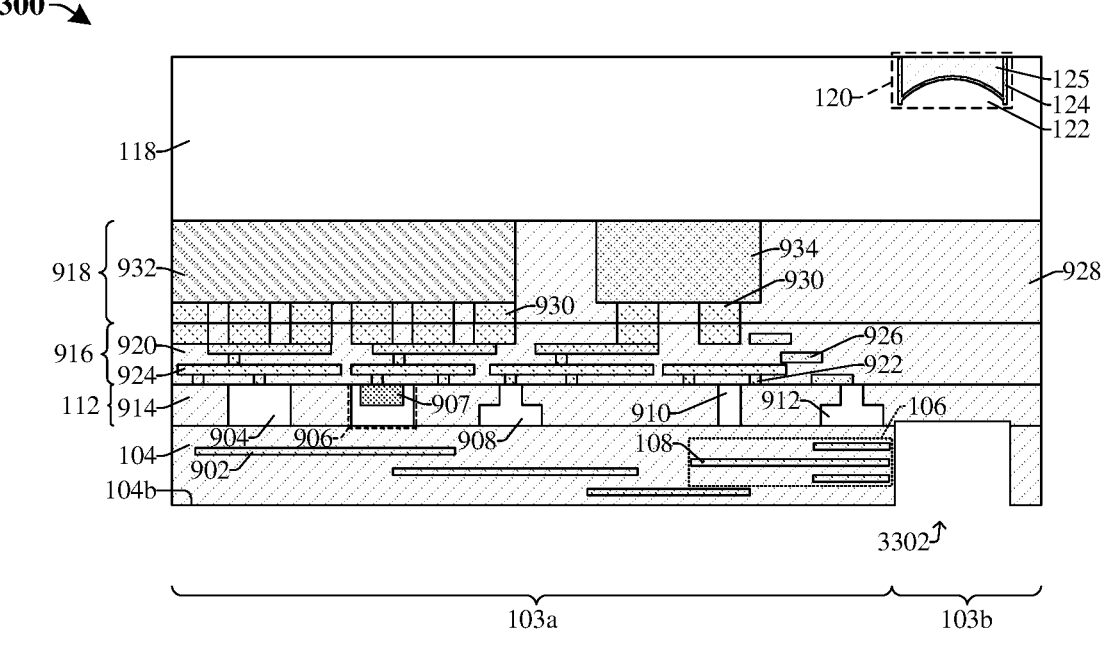
Figures 34, 35:
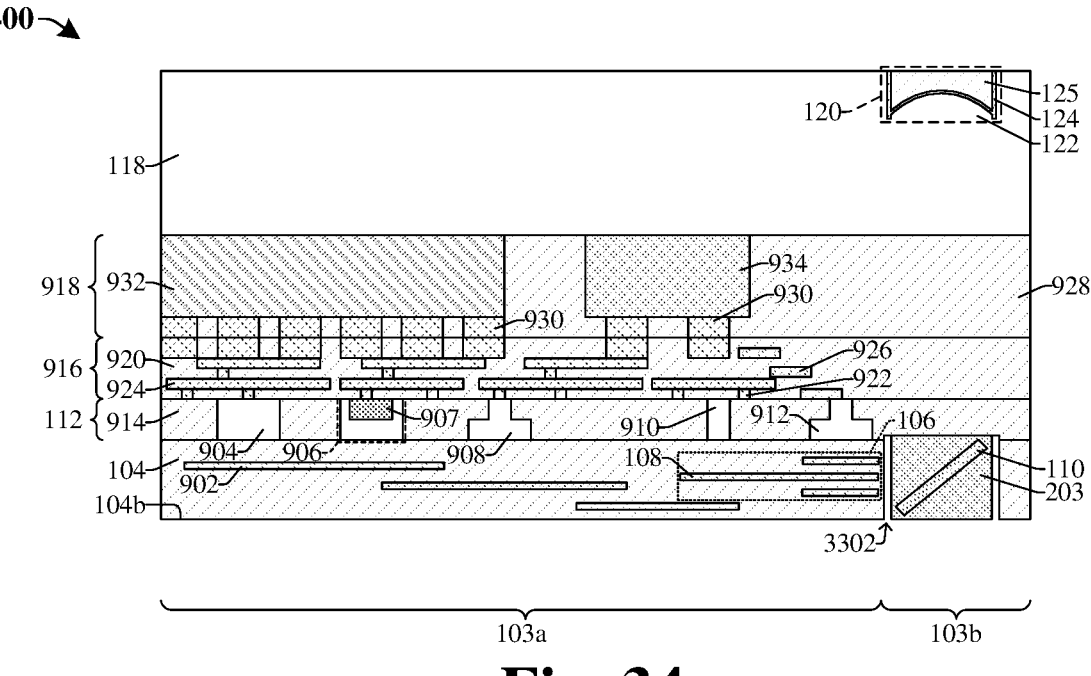

FIGS. 32-35 illustrate cross-sectional views 3200-3500 of some embodiments of acts that may be performed in place of the acts at FIGS. 20-22, such that the method of FIGS. 12-24 may alternatively proceed from FIGS. 12-19 to FIGS. 32-35 and then from FIG. 35 to FIGS. 23 and 24 (i.e., skipping FIGS. 20-22).

As shown in cross-sectional view 3200 of FIG. 3200, the masking layer 1902 is patterned or developed to form an opening 3202 in the masking layer 1902 within the peripheral region 103*b*.

As shown in cross-sectional view 3300 of FIG. 33, an etching process is performed into the back-side 104*b* of the lower dielectric structure 104 to form a deflector opening 3302 extending into the lower dielectric structure 104 and/or the insulator structure 914. In some embodiments, the etching process includes: exposing the lower dielectric structure 104 and the insulator structure 914 to one or more etchants(s) (e.g., wet etchant(s), dry etchant(s), or any combination of the foregoing) with the masking layer (1902 of FIG. 32) in place; and performing a removal process to remove the masking layer (1902 of FIG. 32). In various embodiments, the etching process includes performing a wet etch, a dry etch, or a combination of the foregoing.

As shown in cross-sectional view 3400 of FIG. 34, a deflector structure 110 and a lower insulator structure 203 are bonded to the insulator structure 914 and/or the lower dielectric structure 104 within the deflector opening (3302 of FIG. 33). In some embodiments, the lower insulator structure 203 may be formed on and/or around the deflector structure 110 by a CVD process, a PVD process, an ALD process, or some other suitable growth or deposition process. The insulator structure 203 may, for example, be bonded to the insulator structure 914 and/or the lower dielectric structure 104 by a fusion bonding process or some other suitable bonding process. In some embodiments, the deflector structure 110 may, for example, be or comprise copper, aluminum, tantalum, aluminum copper, aluminum copper silicon, some other reflective material, or any combination of the foregoing.

As shown in cross-sectional view 3500 of FIG. 35, a sidewall spacer structure 3502 may be formed between sidewalls of the lower insulator structure 203 and the lower dielectric structure 104 and/or the insulator structure 914. The sidewall spacer structure 3502 may, for example, be formed along sidewalls of the lower insulator structure 203 by a CVD process, a PVD process, an ALD process, or some other suitable growth or deposition process. The sidewall spacer structure 3502 may, for example, be or comprise an oxide such as silicon dioxide, silicon nitride, silicon carbide, or the like.

Figure 38:
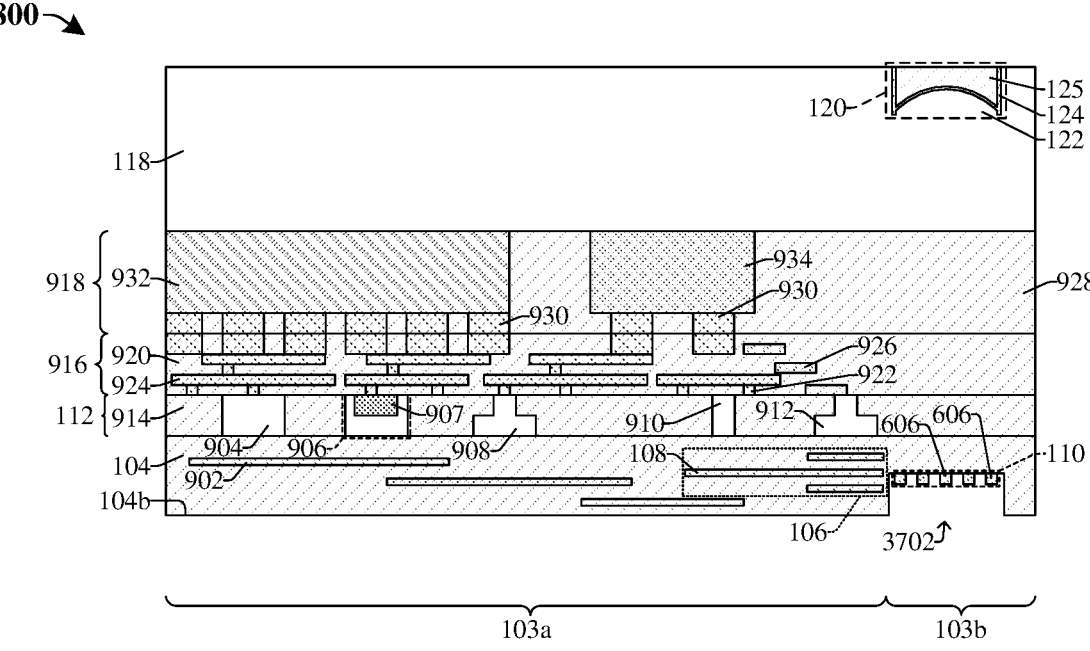
Figure 39:
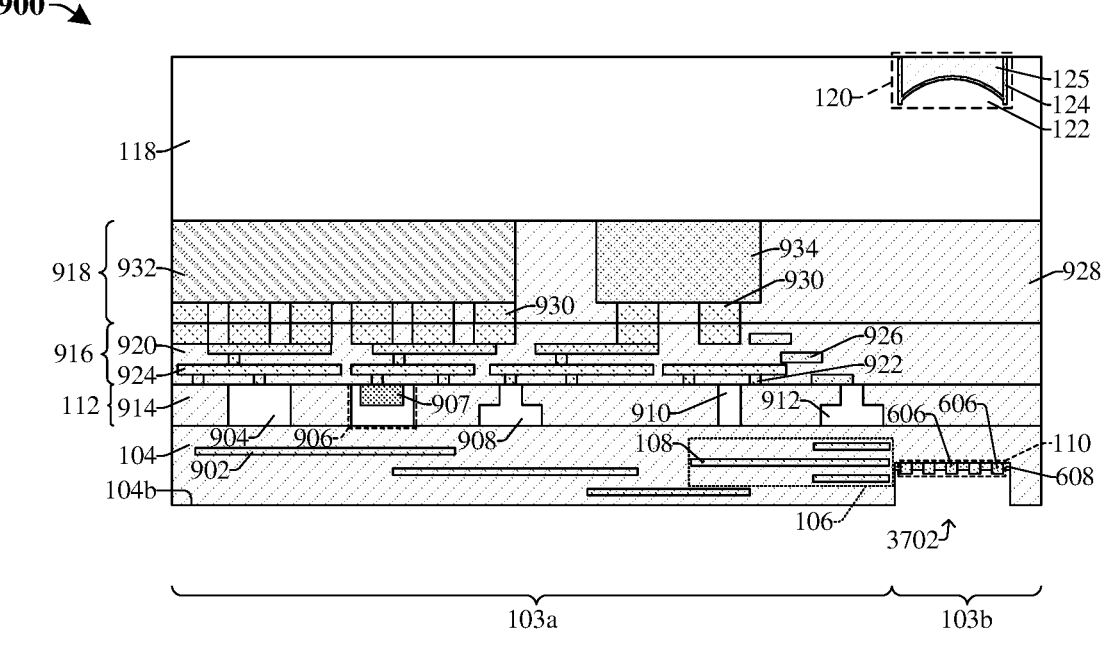
Figure 40:
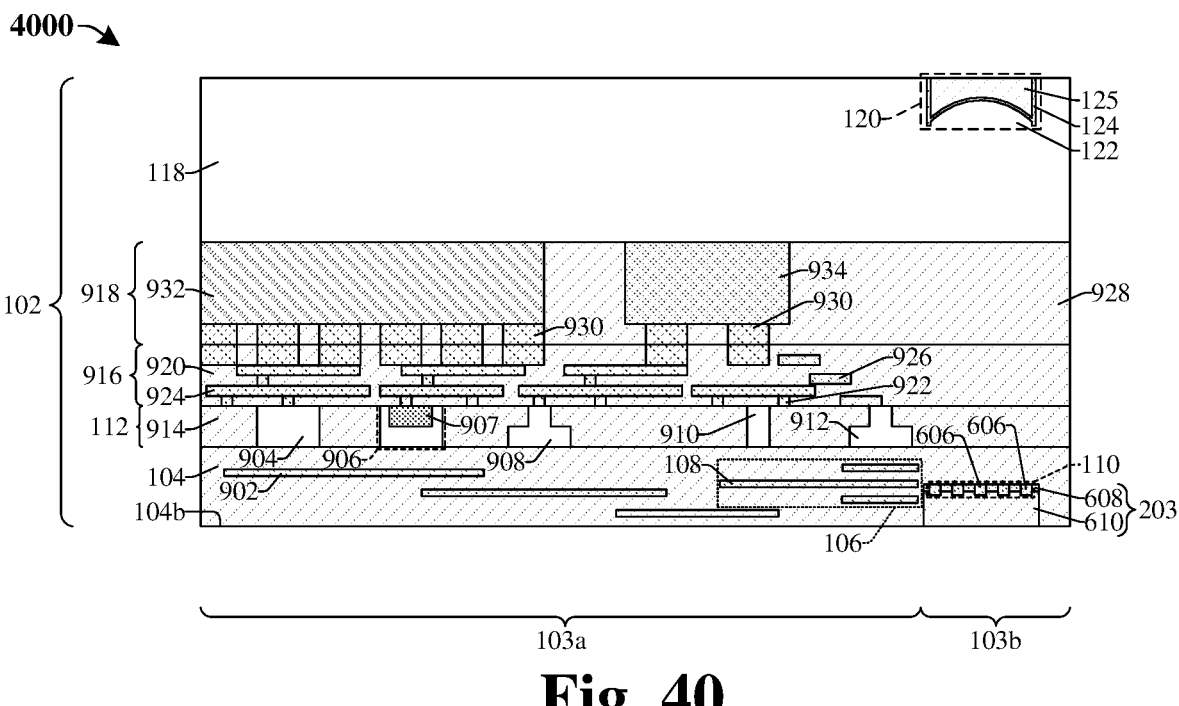
Figure 41:
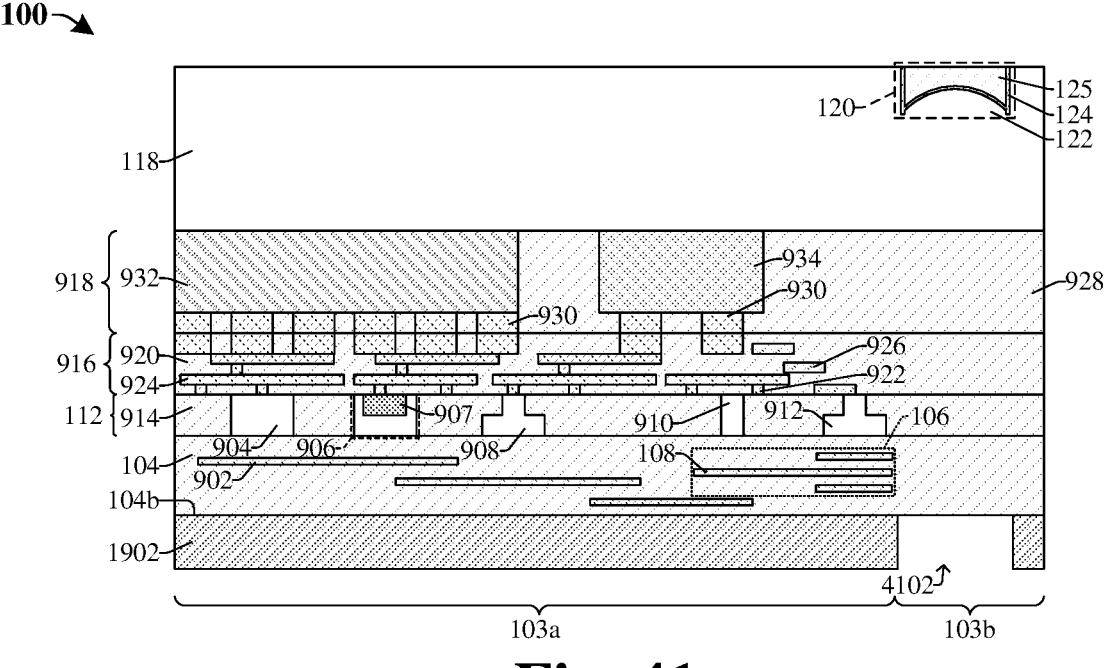
FIGS. 41-45 illustrate cross-sectional views of alternative embodiments of a method for forming a photonic chip that comprises a deflector structure laterally adjacent to an edge coupler.

FIGS. 36-40 illustrate cross-sectional views 3600-4000 of some embodiments of acts that may be performed in place of the acts at FIGS. 20-22, such that the method of FIGS. 12-24 may alternatively proceed from FIGS. 12-19 to FIGS. 36-40 and then from FIG. 40 to FIGS. 23 and 24 (i.e., skipping FIGS. 20-22).

As shown in cross-sectional view 3600 of FIG. 3600, the masking layer 1902 is patterned or developed to form an opening 3602 in the masking layer 1902 within the peripheral region 103*b*.

Figures 36, 37:
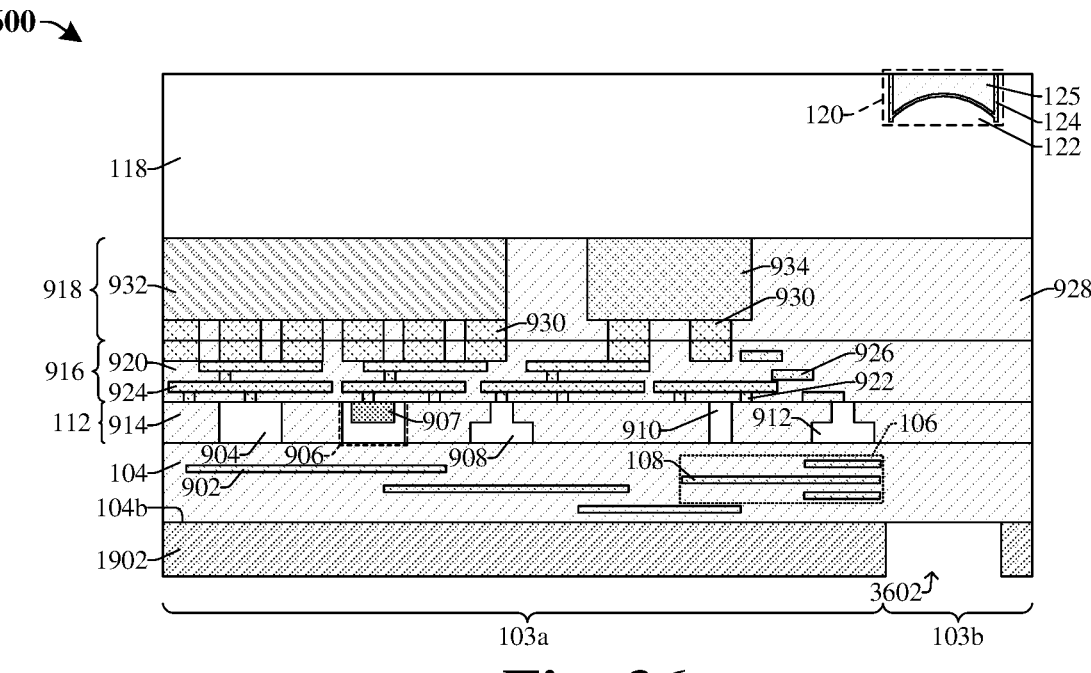
FIGS. 36-40 illustrate cross-sectional views of various embodiments of a method for forming a photonic chip that comprises a deflector structure laterally adjacent to an edge coupler.

As shown in cross-sectional view 3700 of FIG. 37, an etching process is performed into the back-side 104*b* of the lower dielectric structure 104 to form a deflector opening 3702 extending into the lower dielectric structure 104. In some embodiments, the etching process includes: exposing the lower dielectric structure 104 to one or more etchants(s) (e.g., wet etchant(s), dry etchant(s), or any combination of the foregoing) with the masking layer (1902 of FIG. 36) in place; and performing a removal process to remove the masking layer (1902 of FIG. 36). In various embodiments, the etching process includes performing a wet etch, a dry etch, or a combination of the foregoing.

As shown in cross-sectional view 3800 of FIG. 38, a deflector structure 110 is formed along an upper surface of the lower dielectric structure 104, where the deflector structure 110 comprises a plurality of photonic crystal structures 606. In some embodiments, the photonic crystal structures 606 are disposed along the upper surface of the lower dielectric structure 104 and are laterally separated from one another. In various embodiments, a process for forming the deflector structure 110 includes: depositing (e.g., by PVD, ALD, CVD, etc.) a photonic crystal material lining the deflector opening 3702; and patterning the photonic crystal material to form the plurality of photonic crystal structures 606.

As shown in cross-sectional view 3900 of FIG. 39, a first insulator layer 608 is formed within the deflector opening 3702 between the photonic crystal structures 606. In some embodiments, the first insulator layer 608 is formed on the lower dielectric structure 104 by a CVD process, a PVD process, an ALD process, or some other suitable growth or deposition process.

As shown in cross-sectional view 4000 of FIG. 40, a second insulator layer 610 is formed on the first insulator layer 608 and fills a remaining portion of the deflector opening (3702 of FIG. 39), thereby defining a lower insulator structure 203. The second insulator layer 610 may be formed on the first insulator layer 608 by, for example, a CVD process, a PVD process, an ALD process, or some other suitable growth or deposition process. In further embodiments, a planarization process (e.g., a CMP process) may be performed into the second insulator layer 610 such that a bottom surface of the second insulator layer 610 is co-planar with the back-side 104b of the lower dielectric structure 104.

Figure 43:
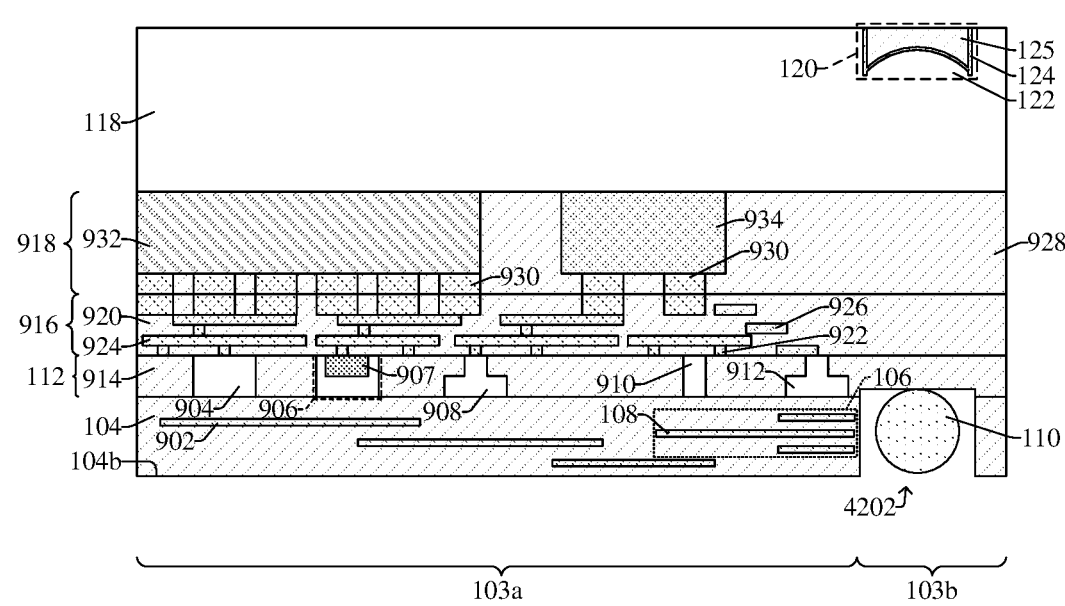
Figure 44:
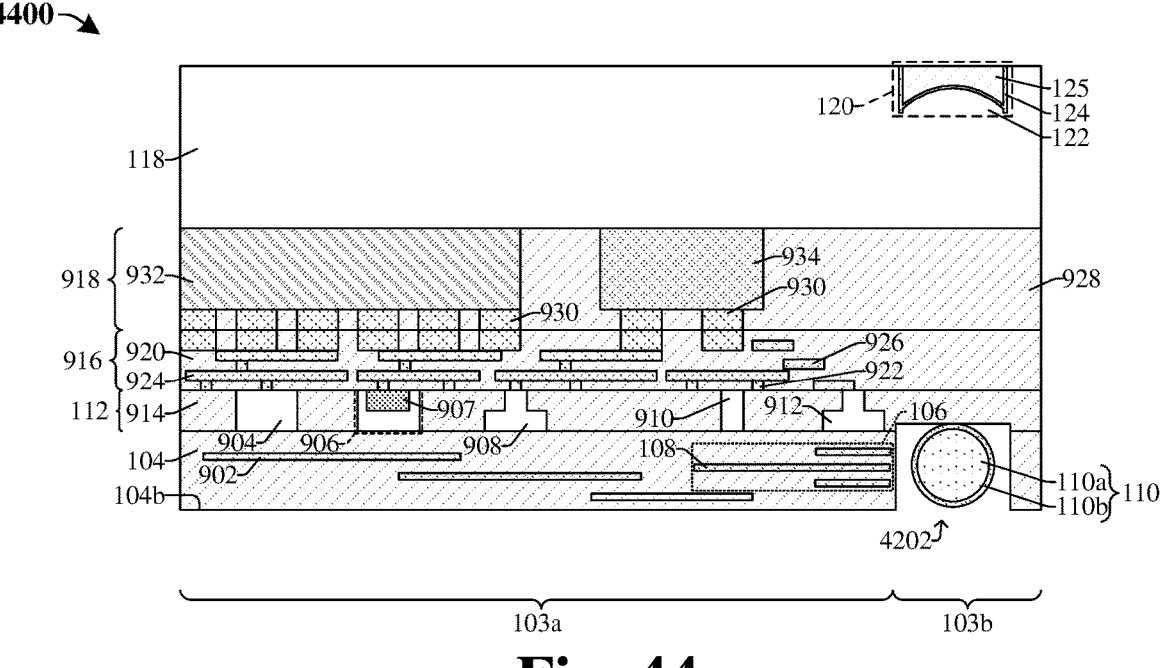
Figure 45:
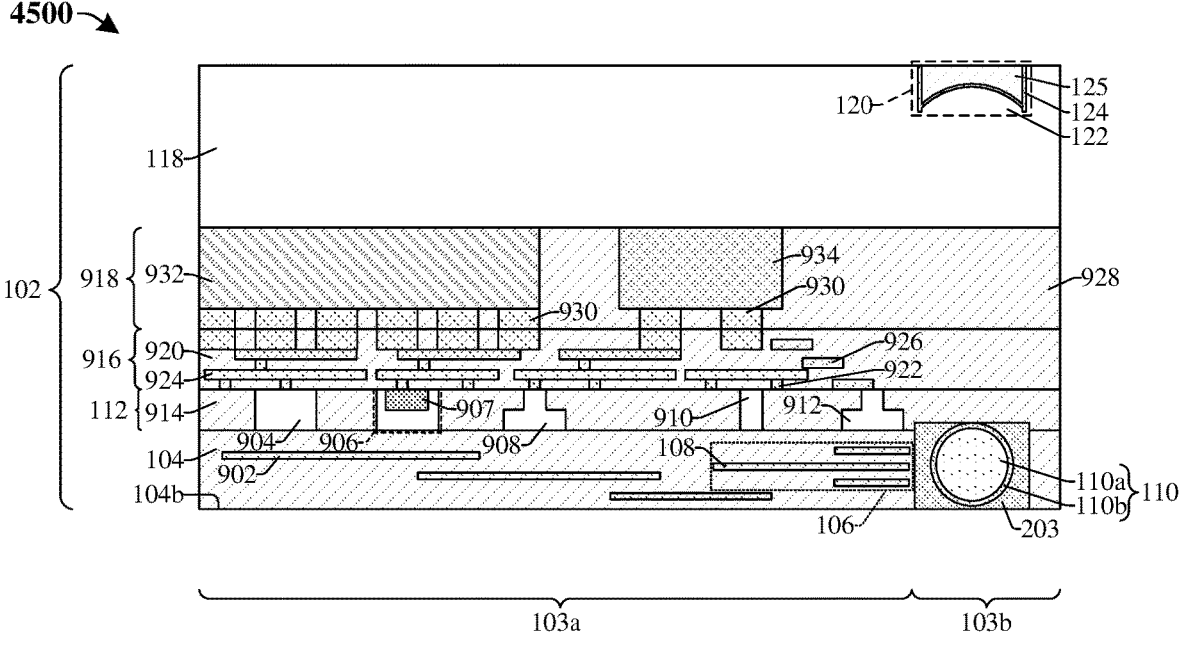

FIGS. 41-45 illustrate cross-sectional views 4100-4500 of some embodiments of acts that may be performed in place of the acts at FIGS. 20-22, such that the method of FIGS. 12-24 may alternatively proceed from FIGS. 12-19 to FIGS. 41-45 and then from FIG. 45 to FIGS. 23 and 24 (i.e., skipping FIGS. 20-22).

As shown in cross-sectional view 4100 of FIG. 4100, the masking layer 1902 is patterned or developed to form an opening 4102 in the masking layer 1902 within the peripheral region 103b.

Figure 42:
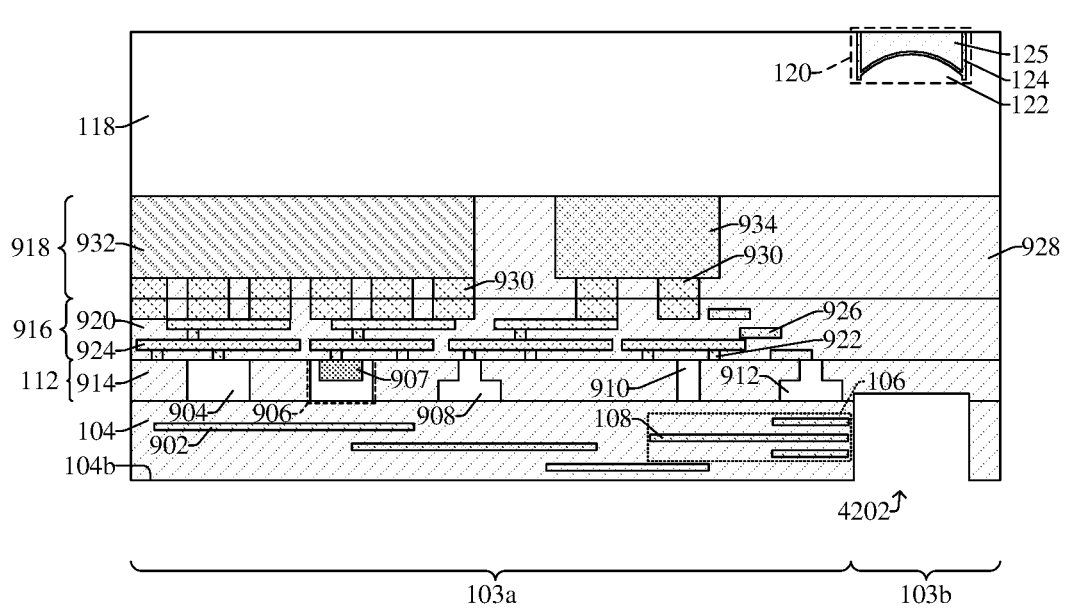

As shown in cross-sectional view 4200 of FIG. 42, an etching process is performed into the back-side 104b of the lower dielectric structure 104 and/or the insulator structure 914 to form a deflector opening 4202 extending into the lower dielectric structure 104 and/or the insulator structure 914. In some embodiments, the etching process includes: exposing the lower dielectric structure 104 and/or the insulator structure 914 to one or more etchants(s) (e.g., wet etchant(s), dry etchant(s), or any combination of the foregoing) with the masking layer (1902 of FIG. 41) in place; and performing a removal process to remove the masking layer (1902 of FIG. 41). In various embodiments, the etching process includes performing a wet etch, a dry etch, or a combination of the foregoing.

As shown in cross-sectional view 4300 of FIG. 43, a deflector structure 110 is formed within the deflector opening 4202 along an upper surface of the insulator structure 914. The deflector structure 110 may be formed by, for example, a PVD process, a CVD process, an ALD process, or some other suitable growth or deposition process. In various embodiments, the deflector structure 110 may be formed such that the deflector structure 110 is spherical in shape and comprises a first material (e.g., silicon dioxide, quartz, etc.).

As shown in cross-sectional view 4400 of FIG. 44, a coating process is performed on the deflector structure 110 such that the deflector structure 110 has an inner core 110a comprising the first material and an outer liner 110b comprising a second material (e.g., copper, aluminum, aluminum copper, aluminum copper silicon, etc.). In various embodiments, the outer liner 110b surrounds an entire outer perimeter of the inner core 110a and defines an outer perimeter of the deflector structure 110.

As shown in cross-sectional view 4500 of FIG. 45, a lower insulator structure 203 is formed around the deflector structure 110, thereby filling a remaining portion of the deflector opening (4202 of FIG. 44). In various embodiments, the lower insulator structure 203 may be formed on the deflector structure 110, for example, by a CVD process, a PVD process, an ALD process, or some other suitable deposition or growth process. In some embodiments, a planarization process (e.g., a CMP process) may be performed on the lower insulator structure 203 such that the back-side 104b of the lower dielectric structure 104 is co-planar with a bottom surface of the lower insulator structure 203.

Accordingly, in some embodiments, the present disclosure relates to a semiconductor structure comprising an edge coupler laterally adjacent to a deflector structure, where a first I/O structure directly overlies the deflector structure.

In some embodiments, the present application provides a semiconductor device, including: a dielectric structure disposed on a first substrate; an edge coupler disposed within the dielectric structure, wherein the edge coupler comprises a plurality of optical core segments; and a deflector structure disposed within the dielectric structure and laterally adjacent to the edge coupler, wherein the deflector structure is configured to redirect an optical signal traveling along a first direction to a second direction towards the edge coupler. In an embodiment, sidewalls of the optical core segments continuously extend in the first direction, and wherein the deflector structure comprises an upper surface angled relative to the first direction. In an embodiment, the first direction is orthogonal to the second direction. In an embodiment, the semiconductor device further comprises a first input/output (I/O) structure disposed over the first substrate, wherein the first I/O structure comprises a first lens directly overlying the deflector structure, wherein the first lens has a curved upper surface. In an embodiment, the semiconductor device further comprises an optical receiver or transmitter overlying the first I/O structure, wherein the optical receiver or transmitter comprises a plurality of optical fibers overlying a second I/O structure, wherein the optical fibers are configured to transmit the optical signal along the second direction, and wherein the optical receiver or transmitter is configured to transmit the optical signal along the first direction through the second I/O structure towards the first I/O structure. In an embodiment, the second I/O structure comprises a second lens directly over the first lens, wherein a width of the first lens is different from a width of the second lens. In an embodiment, the deflector structure comprises a plurality of first deflector layers alternatingly stacked with a plurality of second deflector layers, wherein the first deflector layers comprise a first material and the second deflector layers comprise a second material different from the first material. In an embodiment, the deflector structure comprises a curved upper surface facing the edge coupler. In an embodiment, the deflector structure has a spherical shape when viewed in cross section.

In some embodiments, the present application provides a semiconductor package, including: a lower substrate; a first integrated circuit (IC) chip and a second IC chip overlying the lower substrate and laterally adjacent to one another; and a photonic chip overlying the lower substrate, wherein the photonic chip is adjacent to the second IC chip, wherein the first IC chip, the second IC chip, and the photonic chip are electrically coupled to one another by one or more metallization layers, wherein the photonic chip comprises an edge coupler disposed in an inner device region and a deflector structure disposed in a peripheral region adjacent to the inner device region, wherein a surface of the deflector structure faces the edge coupler. In an embodiment, the photonic chip is configured to receive an optical signal and convert the optical signal to an electrical signal, wherein the first and second IC chips are configured to receive the electrical signal from the photonic chip by way of the one or more metallization layers. In an embodiment, a plurality of first waveguides are disposed in the inner device region, wherein the first waveguides are optically coupled to the edge coupler and are laterally separated from the deflector structure by the edge coupler. In an embodiment, the package structure further comprises an optical receiver or transmitter overlying the photonic chip and configured to transmit an optical signal in a first direction, wherein the deflector structure is configured to deflect the optical signal from the first direction a second direction towards the edge coupler, wherein the edge coupler is configured to receive the optical signal deflected by the deflector structure. In an embodiment, the first waveguides are configured to receive the optical signal from the edge coupler. In an embodiment, the edge coupler comprises a plurality of optical core segments having sidewalls facing the surface of the deflector structure, wherein the optical core segments are arranged in a cross-like layout when viewed in cross section.

In some embodiments, the present application provides a method for forming a semiconductor structure, the method includes: forming a plurality of photonic devices in a first substrate, wherein the photonic devices are disposed within an inner device region; forming an insulator structure around the photonic devices; forming a lower dielectric structure on a back-side surface of the first substrate; forming an edge coupler in the lower dielectric structure and within the inner device region; and forming a deflector structure within the lower dielectric structure, wherein the deflector structure is disposed within a peripheral region laterally adjacent to the edge coupler. In an embodiment, forming the deflector structure includes: forming a patterned masking layer along a back-side of the lower dielectric structure; etching the lower dielectric structure with the patterned masking layer in place to form a deflector opening extending into the back-side of the lower dielectric structure; forming the deflector structure within the deflector opening; and depositing a lower insulator structure along a surface of the deflector structure and sidewalls of the lower dielectric structure. In an embodiment, the lower dielectric structure is etched such that an upper surface of the lower dielectric structure is slanted relative to the back-side of the lower dielectric structure. In an embodiment, the method further includes forming a plurality of first waveguides within the lower dielectric structure, wherein at least one waveguide in the plurality of first waveguides is formed concurrently with the edge coupler. In an embodiment, the method further includes: forming a first interconnect structure over the plurality of photonic devices; bonding an electronic IC structure to the first interconnect structure; bonding a second substrate to the electronic IC structure; and forming a first input/output (I/O) structure within the second substrate, wherein the first I/O structure directly overlies the deflector structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a plurality of photonic devices in a first substrate layer, wherein the photonic devices are laterally spaced apart from one another and disposed within an inner device region;
   forming an insulator structure around the photonic devices;
   forming a lower dielectric structure on a back-side surface of the first substrate layer;
   forming an edge coupler in the lower dielectric structure and within the inner device region;
   forming a patterned masking layer along a lower surface of the lower dielectric structure;
   etching the lower dielectric structure with the patterned masking layer in place to form an opening extending into the lower surface of the lower dielectric structure;
   forming a deflector structure within the opening, wherein the deflector structure is disposed within a peripheral region laterally adjacent to the edge coupler and laterally offset from the plurality of photonic devices by a non-zero distance; and
   depositing a lower insulator structure along a surface of the deflector structure and sidewalls of the lower dielectric structure.

2. The method of claim 1, wherein the lower dielectric structure is etched such that an upper surface of the lower dielectric structure is slanted relative to the lower surface of the lower dielectric structure.

3. The method of claim 1, further comprising:
   forming a plurality of first waveguides within the lower dielectric structure, wherein at least one waveguide in the plurality of first waveguides is formed concurrently with the edge coupler.

4. The method of claim 1, further comprising:
   forming a first interconnect structure over the plurality of photonic devices;
   bonding an electronic IC structure to the first interconnect structure;
   bonding a second substrate to the electronic IC structure; and
   forming a first input/output (I/O) structure within the second substrate, wherein the first I/O structure directly overlies the deflector structure.

5. The method of claim 1, wherein the edge coupler comprises a plurality of optical core segments having one or more sidewalls facing a surface of the deflector structure, wherein when viewed in cross section the optical core segments are arranged in a cross-like layout.

6. The method of claim 1, wherein forming the deflector structure comprises:
   bonding the deflector structure to the insulator structure.

7. The method of claim 6, further comprising:
   forming a dielectric layer between the deflector structure and the sidewalls of the lower dielectric structure.

8. The method of claim 1, wherein a lateral distance between the deflector structure and the edge coupler is less than a width of the deflector structure.

9. The method of claim 1, wherein the edge coupler directly underlies a bottom surface of a first photonic device in the plurality of photonic devices.

10. A method for forming an integrated chip, comprising:

forming a first dielectric structure having a first surface over a second surface;

forming one or more photonic devices in the first dielectric structure;

forming an optical input/output (I/O) structure over the first surface of the first dielectric structure wherein forming the optical I/O structure comprises:

bonding a substrate to the first dielectric structure;

etching the substrate to form a lens structure in the substrate, wherein an upper surface of the lens structure is vertically below a top surface of the substrate;

depositing a liner layer on the lens structure; and depositing a first insulator layer on the liner layer, wherein the optical I/O structure comprises the lens structure, the liner layer, and the first insulator layer; and forming an edge coupler in a second dielectric structure on the second surface of the first dielectric structure, wherein the edge coupler is laterally offset from the optical I/O structure; and forming a deflector structure in the second dielectric structure and under the optical I/O structure, wherein the deflector structure is laterally offset from the edge coupler by a non-zero distance and the deflector structure comprises a material different from that of the edge coupler.

11. The method of claim 10, further comprising:

forming one or more waveguides in the second dielectric structure, wherein the one or more waveguides are optically coupled to the edge coupler.

12. The method of claim 10, wherein the deflector structure comprises a curved surface facing the edge coupler.

13. The method of claim 10, further comprising:

forming an interconnect structure on the first surface of the first dielectric structure, wherein the interconnect structure comprises a plurality of conductive interconnects and one or more waveguides arranged in an interconnect dielectric structure;

bonding an electronic integrated circuit (IC) to the interconnect structure; and bonding an optical source structure to the interconnect structure, wherein the optical I/O structure is vertically above the electronic IC and the optical source structure.

14. The method of claim 13, wherein the electronic IC, the optical source structure, and the one or more photonic devices are arranged laterally in a device region, wherein the optical I/O structure and the deflector structure are arranged laterally in a peripheral region adjacent to the device region.

15. The method of claim 10, wherein forming the deflector structure comprises:

etching the second dielectric structure to form a lateral surface and opposing sidewalls in the second dielectric structure;

forming a first layer on the lateral surface, wherein the first layer comprises a plurality of segments laterally offset from one another; and forming a second layer on the lateral surface and between the plurality of segments, wherein a refractive index of the first layer is different from a refractive index of the second layer.

16. The method of claim 15, further comprising:

forming a second insulator layer on the first and second layers and along the opposing sidewalls of the second dielectric structure, wherein the second insulator layer comprises a material different from that of the first layer and the second layer.

17. The method of claim 10, wherein forming the deflector structure comprises:

etching the second dielectric structure to form a deflector opening in the second dielectric structure; and depositing a stack of deflector layers on a surface of the second dielectric structure that at least in part defines the deflector opening, wherein the surface of the second dielectric structure faces the edge coupler, wherein the stack of deflector layers comprises a plurality of first deflector layers alternatively stacked with a plurality of second deflector layers, wherein the first deflector layers comprise a first material and the second deflector layers comprise a second material different from the first material.

18. A method for forming an integrated chip, comprising:

patterning a device layer that overlies a first substrate to form a plurality of optical devices;

depositing a first dielectric structure over the first substrate and around the plurality of optical devices;

forming an interconnect structure on a first surface of the first dielectric structure;

forming a first optical input/output (I/O) structure over the interconnect structure;

removing the first substrate;

forming a second optical I/O structure in a second dielectric structure on a second surface of the first dielectric structure, wherein the second surface of the first dielectric structure underlies the first surface of the first dielectric structure;

patterning the second dielectric structure to form an opening in the second dielectric structure, wherein the opening underlies the first optical I/O structure and is laterally adjacent to the second optical I/O structure; and forming a deflector structure in the opening.

19. The method of claim 18, wherein a height of the deflector structure is greater than a height of the second optical I/O structure.

20. The method of claim 18, wherein the deflector structure comprises a metal.

* * * * *